United States Patent
Ray

(10) Patent No.: US 10,958,302 B1
(45) Date of Patent: Mar. 23, 2021

(54) SIGNAL CUEING USING AN IIR FILTER ARRAY WITH INVERTED STATE TREE

(71) Applicant: The Boeing Company, Chicago, IL (US)

(72) Inventor: Gary A. Ray, Issaquah, WA (US)

(73) Assignee: The Boeing Company, Chicago, IL (US)

( * ) Notice: Subject to any disclaimer, the term of this patent is extended or adjusted under 35 U.S.C. 154(b) by 0 days.

(21) Appl. No.: 16/871,521

(22) Filed: May 11, 2020

(51) Int. Cl.
*H04B 1/7093* (2011.01)
*H04B 1/10* (2006.01)
*H04B 1/00* (2006.01)
*H03H 17/00* (2006.01)
*H03H 17/02* (2006.01)

(52) U.S. Cl.
CPC ....... *H04B 1/7093* (2013.01); *H03H 17/0063* (2013.01); *H03H 17/0288* (2013.01); *H04B 1/0078* (2013.01); *H04B 1/1036* (2013.01); *H03H 2017/009* (2013.01)

(58) Field of Classification Search
CPC .. H04B 1/7093; H04B 1/0078; H04B 1/1036; H03H 17/0063; H03H 17/0288; H03H 2017/009
USPC .................. 375/232–235, 316, 343, 349, 350
See application file for complete search history.

(56) References Cited

U.S. PATENT DOCUMENTS

| | | | | |
|---|---|---|---|---|
| 5,640,416 A | * | 6/1997 | Chalmers | H04B 1/7085 375/147 |
| 6,256,337 B1 | * | 7/2001 | Hendrickson | H04L 1/24 375/140 |
| 9,866,422 B1 | | 1/2018 | Ray | |
| 9,954,561 B2 | | 4/2018 | Ray et al. | |
| 10,135,475 B1 | * | 11/2018 | Ray | H03M 13/27 |
| 10,429,491 B2 | | 10/2019 | Ray et al. | |
| 2007/0177690 A1 | * | 8/2007 | Watanabe | H04L 27/066 375/316 |

OTHER PUBLICATIONS

Zhu et al., "Design and Implementation of a Cueing Wideband Digital EW Receiver," J. Electronic Science and Technology of China, vol. 4, No. 3, Sep. 2006, pp. 257-264.

* cited by examiner

*Primary Examiner* — Don N Vo
(74) *Attorney, Agent, or Firm* — Ostrager Chong Flaherty & Broitman P.C.

(57) ABSTRACT

Efficient and low-latency cueing means for initiating and updating a process of signal detection and separation in a wideband receiver. The method uses an array of IIR filters that feed an inverted state tree. The inverted state tree provides the directions for separating, detecting, and tracking multiple simultaneous signals that are being received. These signals could be either radar or communications signals and are of widely differing frequencies, bandwidths, and other characteristics. The directions are sent by the cueing system to a set of tunable tracking filters and continuously updated so that the set of tracking filters produce noise-reduced, separated signals on their outputs representing the various simultaneous incoming signals.

20 Claims, 12 Drawing Sheets

SIGNAL CUEING USING AN IIR FILTER ARRAY WITH INVERTED STATE TREE

BACKGROUND

The technology disclosed herein generally relates to methods and apparatus for detecting and classifying repetitive signals and, in particular, relates to signal detection, separation, and tracking of repetitive signals in a wideband receiver.

A receiver system is any system configured to receive and process electromagnetic radiation to identify information carried by the electromagnetic radiation. Typically, a receiver system includes a transducer and a receiver. The transducers used in a receiver system are typically configured to convert received electromagnetic radiation into an analog electrical signal (e.g., antennas). A receiver processes the analog electrical signal generated by the transducer to obtain information about an unknown signal carried by the electromagnetic radiation.

Oftentimes, electromagnetic radiation is used to carry repetitive signals. A repetitive signal is a signal that has a time period over which some aspect of the signal repeats. Repetitive signals are used in timing, synchronization, radar, sonar, and other operations. For example, the characteristics of a repetitive signal may be used to synchronize two or more devices.

In some situations, a receiver system may receive electromagnetic radiation carrying an unknown repetitive signal, but may be unable to identify desired information about the repetitive signal. For example, the receiver system may be unable to detect and/or classify the repetitive signal. Classifying a repetitive signal may include estimating the frequency and bandwidth of the repetitive signal.

Some wideband receivers employ a signal cueing system that initiates signal detection, separation, and tracking. Here cueing means detecting and processing received signals to provide information that can help with signal separation and tracking. Previous cueing solutions either scan for signals or use fixed channels with chosen fixed bandwidths. In the first case, the latency can be very long before a signal is found; and in the second case, the channels are typically not matched to the bandwidths of each incoming signal so that detection/separation has suboptimal reliable and poor quality.

SUMMARY

The subject matter disclosed in some detail below is directed to efficient and low-latency cueing means for initiating and updating a process of signal detection and separation in a wideband receiver. The method proposed herein uses an array of IIR filters that feed an inverted state tree. The inverted state tree provides the directions for separating, detecting, and tracking multiple simultaneous signals that are being received. These signals could be either radar or communications signals and are of widely differing frequencies, bandwidths, and other characteristics. The directions are sent by the cueing system to a set of tunable tracking filters and continuously updated so that the set of tracking filters produce noise-reduced, separated signals on their outputs representing the various simultaneous incoming signals.

The cueing system proposed herein is applicable to a signal separation and tracking stage within an electronic warfare (EW) receiver which must produce pulse descriptor words (PDWs) for a large number of incoming radar signals. Or the cueing system could be used by a commercial 5G system that monitors a very wide bandwidth and characterizes all the incoming interfering signals as well as its own signals in order to reduce interference or increase bandwidth usage. In addition, the cueing system could also serve as the front end portion of a commercial receiver that monitors aircraft collision avoidance radars near airports.

The innovative cueing system disclosed herein includes an IIR filter array with tree of decision nodes that can cue a set of tunable tracking filters that provide concurrent detection, separation and characterization of large numbers of simultaneous incoming signals of wide bandwidth. Specifically, the proposed cueing method is able to detect signal energy with a latency that is dependent directly on the signal's strength rather than on the bandwidth of a receiver channel. Thus, the cueing system is capable of detecting this energy as quickly as possible for higher-SNR signals while still detecting low-SNR signals within a time interval that is inversely proportional to their SNR (which is theoretically the best that can be done). Thus, the cueing process is not compromised by architectural decisions made in the receiver such as chosen fixed channel bandwidths and other artifacts. In addition, the cueing system proposed herein also provides frequency and bandwidth estimates and from that selects the best filter coefficients (or equivalently center frequency and bandwidth) of each signal detected in order to initialize a separation filter for each such signal. This allows rapid simultaneous separation and characterization of all the incoming signals within the input bandwidth. Thus, approach adopted herein creates an entirely new wideband receiver architecture that does not use channelization.

Although various embodiments of systems and methods for cueing unknown signals using an IIR filter array with inverted state tree will be described in some detail below, one or more of those embodiments may be characterized by one or more of the following aspects.

One aspect of the subject matter disclosed in detail below is a method for cueing signals comprising: (a) transducing electromagnetic radiation carrying a repetitive signal into an analog electrical signal; (b) converting the analog electrical signal into signal samples; (c) inputting the signal samples to first and second filters configured to pass first and second bandwidths respectively which are partially overlapping; outputting first filtered signal samples from the first filter and second filtered signal samples from the second filter in response to inputting the digital signal samples; (d) processing the first and second filtered signal samples to generate digital data representing an estimated frequency and an estimated bandwidth; (e) processing the first and second filtered signal samples to generate digital data representing an estimated pre-detection metric; (f) determining that the pre-detection metric is greater than a specified threshold; (g) generating filter coefficients for a tunable filter which are functions of the estimated frequency and the estimated bandwidth; and (h) tuning the tunable filter in accordance with the filter coefficients. In one proposed implementation, step (e) comprises calculating a normalized signal energy by dividing a sum of energy differences between the outputs of the first and second filters by a sum of the energies of those outputs.

Another aspect of the subject matter disclosed in detail below is a method for cueing signals comprising: transducing electromagnetic radiation carrying a repetitive signal into an analog electrical signal; converting the analog electrical signal into signal samples; inputting the signal samples to first, second, and third filters configured to pass first, second, and third bandwidths respectively, wherein the first and second bandwidths are partially overlapping, the second and third bandwidths are partially overlapping, and the first and third bandwidths are not partially overlapping; outputting first, second, and third filtered signal samples from the first, second, and third filters respectively in response to inputting the digital signal samples; processing the first and second filtered signal samples to generate digital data representing a first estimated frequency and a first estimated bandwidth; processing the first and second filtered signal samples to generate digital data representing a first estimated pre-detection metric; determining that the first estimated pre-detection metric is greater than a specified threshold; processing the second and third filtered signal samples to generate digital data representing a second estimated frequency and a second estimated bandwidth; processing the second and third filtered signal samples to generate digital data representing a second estimated pre-detection metric; determining that the second estimated pre-detection metric is greater than the specified threshold; joining the first and second estimated bandwidths to form a wider bandwidth that is a union of first and second estimated bandwidths; calculating a center frequency of the wider bandwidth; generating filter coefficients for an available tunable filter which are functions of the calculated center frequency and the wider bandwidth; and tuning the available tunable filter in accordance with the filter coefficients.

A further aspect of the subject matter disclosed in detail below is a signal processing system comprising: a sensor configured to transduce electromagnetic radiation carrying a repetitive signal into an analog electrical signal; an analog-to-digital converter configured to convert the analog electrical signal into signal samples; first and second filters connected to receive the signal samples and configured to pass first and second bandwidths respectively which are partially overlapping; a signal frequency/bandwidth estimator connected to receive first and second filtered signal samples from the first and second filters and configured to process filtered signal samples from two filters to generate digital data representing an estimated frequency and an estimated bandwidth; a pre-detection estimator connected to receive first and second filtered signal samples from the first and second filters and configured to process filtered signal samples from two filters to generate digital data representing an estimated pre-detection metric; a plurality of signal separation and tracking channels, each signal separation and tracking channel comprising a respective tunable filter; a signal separation and tracking controller configured to control tuning of the plurality of signal separation and tracking channels; and a root node connected to receive the estimated frequency and the estimated bandwidth from the signal frequency/bandwidth estimator and receive the estimated pre-detection metric from the pre-detection estimator and communicate with the signal separation and tracking controller, wherein the root node is configured to not send a request for available channel to the signal separation and tracking controller if the estimated pre-detection metric does not indicate that the signal samples were derived from a repetitive signal.

In accordance with one embodiment of the system partly described in the immediately preceding paragraph, the signal separation and tracking controller is further configured to send a channel available signal to the root node in response to receipt of a request for available channel from the root node if one of the plurality of signal separation and tracking channels is available; and the root node is further configured to output state values representing the estimated frequency and the first estimated bandwidth to the available signal separation and tracking channel in response to receipt of the channel available signal from the signal separation and tracking controller.

Yet another aspect of the subject matter disclosed in detail below is a signal cueing system comprising: first, second, and third filters configured to pass first, second, and third bandwidths, respectively, wherein the first and second bandwidths are partially overlapping, the second and third bandwidths are partially overlapping, and the first and third bandwidths are not partially overlapping; a first signal frequency/bandwidth estimator connected to receive first and second filtered signal samples from the first and second filters and configured to process filtered signal samples from two filters to generate digital data representing a first estimated frequency and a first estimated bandwidth; a first pre-detection estimator connected to receive first and second filtered signal samples from the first and second filters and configured to process filtered signal samples from two filters to generate digital data representing a first estimated pre-detection metric; a first root node connected to receive the first estimated frequency and the first estimated bandwidth from the first signal frequency/bandwidth estimator and receive the first estimated pre-detection metric from the first pre-detection estimator, wherein the first root node is configured to not generate a request for available channel if the first estimated pre-detection metric does not indicate that the signal samples were derived from a repetitive signal; a second signal frequency/bandwidth estimator connected to receive second and the filtered signal samples from the second and third filters and configured to process filtered signal samples from two filters to generate digital data representing a second estimated frequency and a second estimated bandwidth; a second pre-detection estimator connected to receive second and third filtered signal samples from the second and third filters and configured to process filtered signal samples from two filters to generate digital data representing a second estimated pre-detection metric; a second root node connected to receive the second estimated frequency and the second estimated bandwidth from the second signal frequency/bandwidth estimator and receive the second estimated pre-detection metric from the second pre-detection estimator, wherein the second root node is configured to not generate a request for available channel to the signal separation and tracking controller if the second estimated pre-detection metric does not indicate that the signal samples were derived from a repetitive signal; and a non-root node connected to receive the state values representing the first estimated frequency, the first estimated bandwidth, and the first estimated pre-detection metric from the first root node and the second estimated frequency, the second estimated bandwidth, and the second pre-detection metric from the second root node, wherein the non-root node is configured to calculate and output state values representing a third estimated frequency and a third estimated bandwidth in response to the first and second estimated bandwidths being adjacent or partially overlapping, the third estimated pre-detection metric being a union of the first and second bandwidths, and further configured to not generate a request for available channel to the signal separation and tracking controller if the third estimated pre-detection metric does not indicate that the signal samples were derived from a repetitive signal.

Other aspects of systems and methods for cueing unknown signals using an IIR filter array with inverted state tree are disclosed and claimed below.

BRIEF DESCRIPTION OF THE DRAWINGS

The features, functions and advantages discussed in the preceding section may be achieved independently in various embodiments or may be combined in yet other embodiments. Various embodiments will be hereinafter described with reference to drawings for the purpose of illustrating the above-described and other aspects.

Reference will hereinafter be made to the drawings in which similar elements in different drawings bear the same reference numerals.

DETAILED DESCRIPTION

Figure 1:
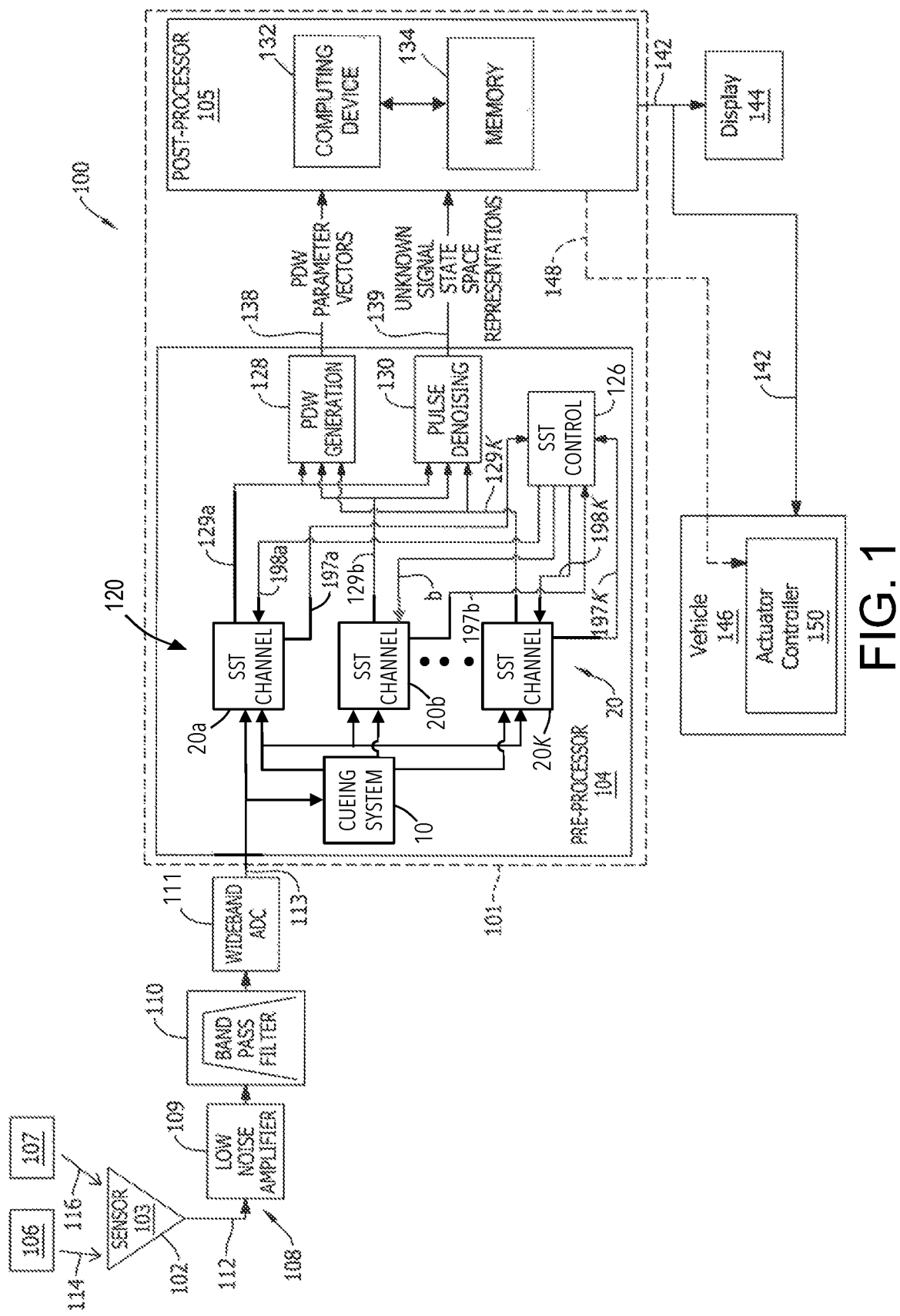
FIG. 1 is a block diagram showing a cueing architecture incorporated in a signal processing system for generating pulse descriptor words (PDWs) using signal separation and tracking (SST).

Various embodiments of systems and methods for cueing unknown signals using an IIR filter array with inverted state tree will now be described in detail for the purpose of illustration. At least some of the details disclosed below relate to optional features or aspects, which in some applications may be omitted without departing from the scope of the claims appended hereto. In addition, not all features of an actual implementation are described in this specification. A person skilled in the art will appreciate that in the development of any such actual embodiment, numerous implementation-specific decisions must be made to achieve the developer's specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Electronic warfare systems are receive-only real-time systems that have front-end receivers that produce pulse descriptor words (PDW) for each radar pulse they detect. Electronic warfare receivers are unlike radar systems in that they do not naturally produce range and they must handle unknown signals rather than look for reflected versions of their transmitted signals. In the commercial world, 5G analysis systems also cover a very large bandwidth and wideband receivers that characterize 5G signals and interfering signals must also handle many unknown signals. The digital versions of these receivers are typically designed as a filter bank. Within each filter channel, radar/communication signals are separated from other coincident signals and have their noise decreased by the relative filter bandwidth compared to the total input bandwidth. These pulses, with their increased SNR, are processed to estimate PDW elements such as pulse width, frequency, time of arrival, bandwidth, and amplitude for signal classification. While such channelizers have many advantages, they also have key disadvantages such as large size, weight and power due to the multipliers and adders required for very large filter banks that operate continuously whether a signal is present or not. In addition, signals that do not match the bandwidth and frequency of each filter in the filter bank are processed sub-optimally or split across filter channels, resulting in missed, false and inaccurate PDWs. Finally, signals of unknown type that do not match the model of simple pulsed signals largely fail to be processed correctly.

If a channelizer is not used, the two main processing tasks of noise reduction and signal separation must be done using different methods. The innovative signal processing system disclosed herein performs both tasks together. Specifically, on-the-fly real-time custom matched filters are constructed which can both separate signals and reduce their noise. These filters are then adapted in real time to also track the signals and provide input to the final signal characterization system that produces PDWs. Note that in addition, these two tasks must be done with very low latency since EW receivers and interference cancellation both require low latency in order to cue their respective outputs in time to react to signal changes.

The signal processing system takes as input a sampled form of an incoming signal $\{x_n\}$ at sample times $\{t_n\}$. This input may have come from the digitized output of an intermediate frequency (IF) receiver, from a digitized channel within a receiver, or from the output of a noise-reducing front end to a receiver among many options. The sampled signal is modeled as:

$$x_n = \sum_i s_i(t_n) + N_n$$

where a collection of incoming signals is denoted $\{s_i(t)\}$ and samples of the receiver noise are denoted by $N_n$. In addition, the center frequency and bandwidth of signal $s_i(t)$ are denoted as $f(s)$ and $w(s)$. The signal separation step must construct and update a filter F for each such input signal $s_i(t)$; this is denoted by $F(s_i)$ and can be either an FIR or IIR digital filter with filter coefficient vectors β (e.g., feedforward filter coefficients) and α (e.g., feedback filter coefficients). Here these coefficient vectors are of length o(F) where this denotes the order of the filter. The idea of the separation filters is to find filters so that $$F(s_i)(s_i(t_n)) \approx s_i(t_n)$$

and $$F(s_i)(s_j(t_n)) \approx s_i(t_n)$$

for $j \neq i$. These filters can be designed using standard filter design software by using (for example) the center frequency $f(s_i)$ and bandwidth $w(s_i)$ of the signal to design $F(s_i)$, i.e., to find its coefficient vectors. The cueing technology disclosed in more detail hereinafter accomplishes initial creation and updating of these separation filters in an efficient manner with very low latency.

FIG. 1 is a block diagram identifying components of a signal processing system 100 for generating PDWs using signal cueing, separation, and tracking. The signal processing system 100 includes a signal data processor 101 communicatively coupled to an antenna 102 by way of a pre-conditioner 108. Antenna 102 may be embodied as a wide-area sensor 103. Signal data processor 101 includes a pre-processor 104 and a post-processor 105. Sensor 103 is configured to surveil at least one radar signal emitter (two radar signal emitters 106 and 107 are indicated). Pre-conditioner 108 includes at least one electronic component (e.g., a low-noise amplifier 109, a band pass filter 110, and a wideband analog-to-digital converter (ADC) 111) configured to pre-condition a sensor output signal 112. In operation, pre-conditioner 108 is configured to convert a sensor output signal 112 received from sensor 103 into a conditioned signal 113 transmitted to pre-processor 104. Each conditioned signal 113 is derived from a time-varying signal received at sensor 103. Time-varying signals may include a mix of signals received from radar signal emitters 106 and 107. For example, time-varying signals may include a first radar signal 114 generated by radar signal emitter 106 or a second radar signal 116 generated by radar signal emitter 107, which signals are received by sensor 103.

The pre-processor 104 includes a cueing system 10 and a signal separation and tracking subsystem 120 (hereinafter "SST subsystem 120). The SST subsystem 120 includes a plurality of signal separation/tracking (SST) channels 20. The total number of SST channels 20 is expressed as an integer K. In operation, incoming signal 113 is transmitted from pre-conditioner 108 to cueing system 10, where the frequency and bandwidth of incoming signal 113 are estimated. More specifically, the cueing system 10 includes a respective signal frequency/bandwidth estimator for each frequency band of interest. Each cueing signal frequency/bandwidth estimator includes a pair of overlapping fixed filters and signal processing circuitry that outputs frequency and bandwidth estimates which are used to tune a respective tunable filter in each SST channel 20a, 20b, ..., 20K. The cueing system 10 detects the presence of signals at certain frequencies and bandwidths, without doing noise reduction as the channelizer would have done in a traditional approach. Instead, noise reduction is done in the SST channels 20a, 20b, ..., 20K. The SST subsystem 120 further includes an SST control module 126 coupled to each SST channel 20. SST control module 126 is configured to transmit a respective SST control signal 198a through 198K to each of SST channels 20, as further shown and described below with reference to FIG. 2.

Pre-processor 104 further includes a PDW generation module 128 and a pulse denoising module 130, both of which are coupled to receive separated signals 129 from the plurality of SST channels 20. PDW generation module 128 generates PDW parameter vector signals 138 based on respective separated signals 129 (e.g., 129a, 129b, ..., 129K) received from the SST channels 20 (e.g., 20a, 20b, ..., 20K). Each PDW parameter vector signal 138 contains data representative of characteristics of interest of one of radar signals 114 and 116 derived from a singular pulse of separated signal 129 (e.g., frequency, bandwidth, time of arrival, time of departure, pulse width, pulse amplitude, pulse repetition interval, and/or angle of arrival (AOA)). Pulse denoising module 130 also generates an unknown signal state space representation signal 139 based on separated signals 129. Unknown signal state space representation signal 139 contains data representative of additional (e.g., non-PDW type) characteristics of interest of one of radar signals 114 and 116 from which usable spatial information about one of radar signal emitters 106 and 107 is discernable. PDW parameter vector signals 138 and unknown signal state space representation signals 139 are transmitted to post-processor 105.

As seen in FIG. 1, post-processor 105 includes a computing device 132 and a memory 134. The memory 134 comprises one or more non-transitory tangible computer-readable storage media. Post-processor 105 is communicatively coupled to pre-processor 104. In accordance with one embodiment, the computing device 132 is a processor running software. The PDW generation module 128 is configured to receive a respective separated signal 129 from each SST channel 20. PDW generation module 128 is further configured to transmit a PDW parameter vector signal 138 to post-processor 105. PDW parameter vector signal 138 received by computing device 132 is stored as computer-readable data in memory 134 including, without limitation, as at least one buffered data set.

The PDW generation module 128 sends each PDW to the computing system 132 as a PDW parameter vector signal 138 similar to (amplitude, time of arrival, center frequency, pulse width and bandwidth)=(amp, toa, f, pw, w). The PDW for each intercepted signal is stored in a pulse buffer for further processing by the computing system 132. As part of such processing, the PDWs are sorted and deinterleaved by clustering the incoming radar pulses into groups. In principle, each group should have characteristics representative of a single radar source or class of radar sources which allows that radar source or class to be identified. The identity of a particular signal is usually inferred by correlating the observed characteristics of that signal with characteristics stored in a list that also contains the identity of known radars.

In addition, the pulse denoising module 130 is configured to receive separated signals 129 from each SST channel 20. Pulse denoising module 130 is further configured to transmit an unknown signal state space representation signal 139 to post-processor 105. Unknown signal state space representation signal 139 received by computing device 132 is stored as computer-readable data in memory 134, including, without limitation, as at least one buffered data set. In an exemplary implementation, computing device 132 fetches buffered data sets from memory 134 for processing using a computer-based method that employs an operating system running software executed from instruction set data also stored in memory 134.

The computing device 132 is configured to perform operations based on data contained in the PDW parameter vector signals 138 and unknown signal state space representation signals 139. Such operations include, without limitation, detecting, processing, quantifying, storing, and controlling a display device 144 for displaying (e.g., in human-readable data form) various characteristics of at least one of the radar signals 114 and 116 represented as data in the PDW parameter vector signals 138 and unknown signal state space representation signals 139. For example, a PDW parameter vector signal 138 generated by PDW generation module 128 may contain a plurality of PDW vector data blocks structured in a vector format, where each PDW vector data block contains one parameter of the first radar signal 114. Parameters representative of at least one characteristic of the first radar signal 114 contained in one PDW vector data block may include, without limitation, frequency, bandwidth, time of arrival, time of departure, pulse width, pulse amplitude, pulse repetition interval, and/or AOA.

Resultant data from operations performed by the computing device 132 are stored in memory 134. Further, in the exemplary implementation, computing device 132 causes post-processor 105 to transmit a human-readable data signal 142 to a human machine interface to facilitate at least one of an interaction, a modification, a visualization, at least one further operation, and a viewable recording of information about at least one radar signal 114 and 116 by a user of signal processing system 100. The human machine interface may be, for example, a display device 144 which receives the human-readable data signal 142 from post-processor 105. In one example, characteristics of radar signal emitters 106 and 107 determined by signal processing system 100 are displayed on display device 144 as a map having a grid representative of a physical spatial domain including a surveillable space of sensor 103, where locations and identifying information of radar signal emitters 106 and 107 are displayed and plotted substantially in real time. The human-readable data signal 142 may also be transmitted from post-processor 105 to at least one device and/or system (e.g., an aerial or ground-based vehicle 146) associated with signal processing system 100. Further, the computing device 132 enables post-processor 105 to transmit, in substantially real time, an actuator control signal 148 to an actuator controller 150 included within vehicle 146 to facilitate controlled movements thereof. For example, vehicle 146 may be a remotely and/or autonomously operated land vehicle or an unmanned aerial vehicle.

In one mode of operation, at least one of frequency and bandwidth information contained in respective PDWs is plotted on a map on the display device 144 along with locations of respective radar signal emitters 106 and 107 to facilitate accurate tracking of locations and association with those particular radar signal emitters. In cases where at least one radar signal emitter is mobile, the map on display device 144 updates location information of at least one respective mobile radar signal emitter in substantially real time. Furthermore, the computing device 132 determines at least one of a velocity, an acceleration, a trajectory, and a track (i.e., including present and prior locations) of one or more mobile radar signal emitters (e.g., radar signal emitters 106 and 107). In another mode of operation, characteristics determined by signal data processing methods implemented by the signal data processor 101 may trigger a variety of substantially real-time physical actions in physical devices and systems in communication with the signal processing system 100. For example, characteristics of various radar signal emitters, including frequency and bandwidth determined by signal data processing methods implemented by signal processing system 100, may be transmitted in substantially real time as data to actuator controller 150 in vehicle 146 (e.g., rudders and flaps of a unmanned aerial vehicle) to facilitate maneuvers thereof, for example, to avoid an area of operation of an unauthorized radar signal emitter determined to be a threat or to move toward the unauthorized emitter to eliminate the threat. As a further example, characteristics of radar signal emitters 106 and 107 determined by signal data processing methods described herein may be transmitted in substantially real time in a control signal to at least one of an electronic support measure (ESM) device and an EW system associated with signal processing system 100 to direct, for example, a radar jamming signal at a particular radar signal emitter operating in the surveillable environment of sensor 103 without authorization.

Each SST channel 20 in signal processing system 100 implements filtering methods with dynamic updating to generate high-quality PDWs containing at least one of amplitude, frequency, center frequency, bandwidth, pulse time of arrival, and pulse width information. In operation, each SST channel 20 separates a respective detected signal. Each SST channel 20 includes a tunable filter that operates in accordance with filter parameters that include, without limitation, a center frequency and a bandwidth generated by the cueing system 10. In operation, each tunable may be embodied as a finite impulse response (FIR) filter or an infinite impulse response (IIR) filter. In an exemplary implementation, use of IIR-type filters enables lower-cost filter devices having greater precision than FIR-type filters.

The frequency and bandwidth estimation method disclosed herein uses the filter response of a pair of IIR filters to estimate frequency f and bandwidth w in noise and with very low latency. The method disclosed herein directly measures f and w within a fixed band and thus does not operate in a blind fashion. The method also allows a cueing system to update tracking filters in a plurality of SST channels.

Figure 2:
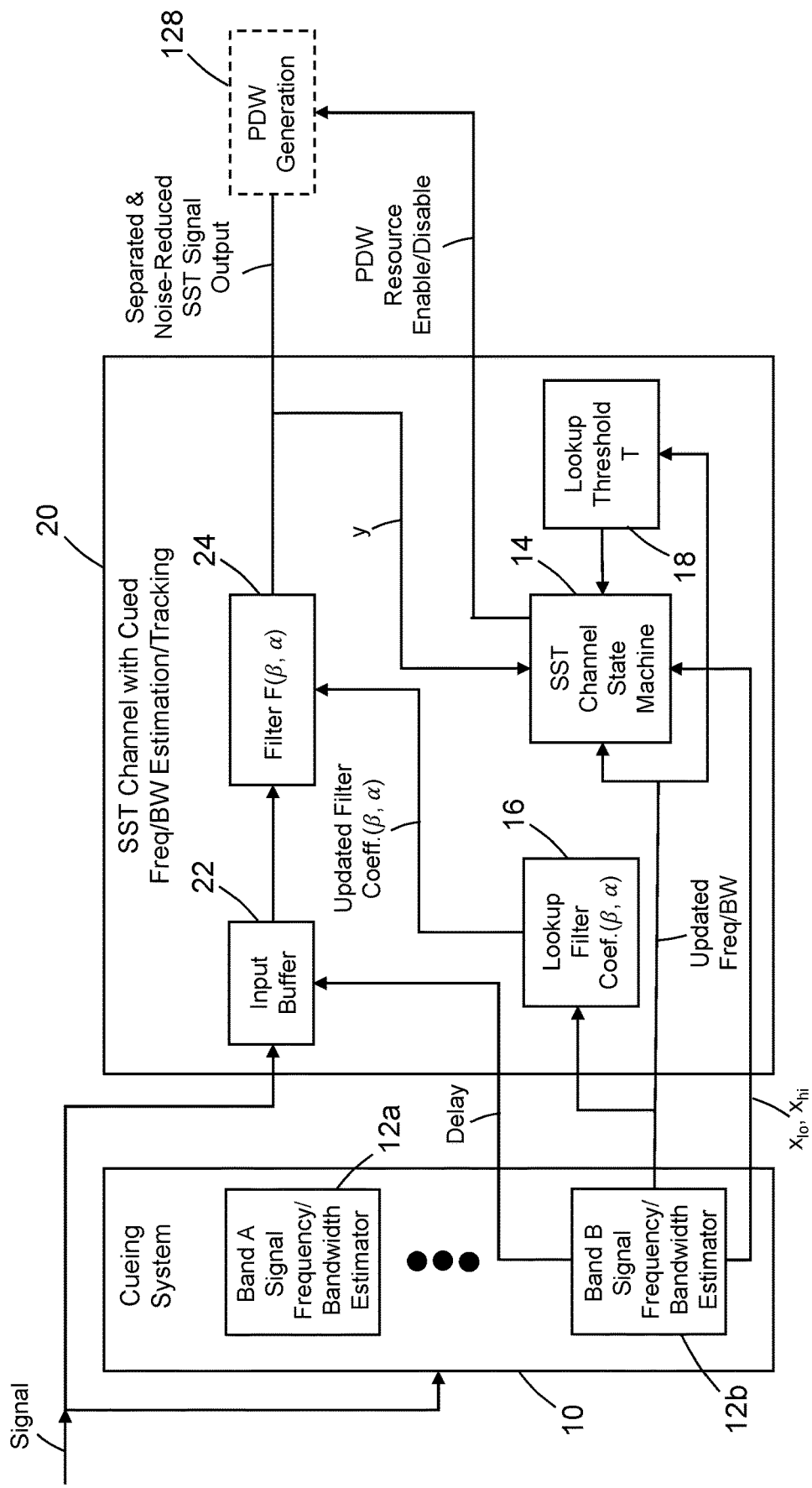
FIG. 2 is a block diagram identifying components of a cueing system and a signal separation and tracking channel (hereinafter "SST channel") that may be used in a signal processing system to track both frequency and bandwidth.

FIG. 2 is a block diagram identifying components of a signal processing system 100 in accordance with one embodiment. The cueing system 10 includes a respective signal frequency/bandwidth estimator for each band of interest. In the example depicted in FIG. 2, one signal frequency/bandwidth estimator 12*a* for band A and another signal frequency/bandwidth estimator 12*b* for band B are shown. Each cueing signal frequency/bandwidth estimator includes a pair of overlapping fixed filters and signal processing circuitry that performs the process depicted in FIG. 8 (described in detail below). The cueing system 10 detects the presence of signals at certain frequencies and bandwidths. Noise reduction is done using the signal separation and tracking filters (e.g., tunable filter 24 in FIG. 2).

Each cueing signal frequency/bandwidth estimator outputs data to a corresponding SST channel 20. Only one such channel, corresponding to signal frequency/bandwidth estimator 12*b*, is shown in FIG. 2. The SST channel 20 shown in FIG. 2 has the following components: (1) a plurality of filter coefficient lookup tables 16 in which values for respective filter coefficients ($\beta$, $\alpha$) are stored; (2) a threshold lookup table 18 storing threshold values T; (3) an SST channel state machine 14; (4) a tunable filter 24; and (5) an input buffer 22. In response to frequency and bandwidth estimates received from the signal frequency/bandwidth estimator 12*b*, filter coefficient lookup tables 16 output filter coefficients to tunable filter 24. The frequency and bandwidth estimates output by signal frequency/bandwidth estimator 12*b* are also input to the SST channel state machine 14 and the threshold lookup table 18. Also the outputs $x_{lo}$ and $x_{hi}$ from high and low filters of the signal frequency/bandwidth estimator 12b are input to the SST channel state machine 14. (As used herein, the terms "low filter" and "high filter" are used in conjunction to refer to a pair of filters having relatively lower and relatively higher center frequencies.) In addition, input buffer module 22 receives a delay signal from signal frequency/bandwidth estimator module 12b. This delay signal controls when the filter input signal is sent from the input buffer 22 to the tunable filter 24.

As used herein, the term "β" in the phrase "filter coefficients (β, α)" refers to a number of feedforward filter coefficients equal to or greater than two; the term "α" in the phrase "filter coefficients (β, α)" refers to a number of feedback filter coefficients equal to or greater than unity. For example, the tunable filter 24 may be a second-order IIR filter having three feedforward filter coefficients $\beta_0$, $\beta_1$, and $\beta_2$ and two feedback filter coefficients $\alpha_1$ and $\alpha_2$, for a total of five filter coefficients. In that case, a respective filter coefficient lookup table 16 is provided for each of the five filter coefficients needed to tune the tunable filter 24. In response to frequency and bandwidth estimates received from the signal frequency/bandwidth estimator 12b, those five lookup tables would output the five filter coefficients to tunable filter 24.

Figure 3:
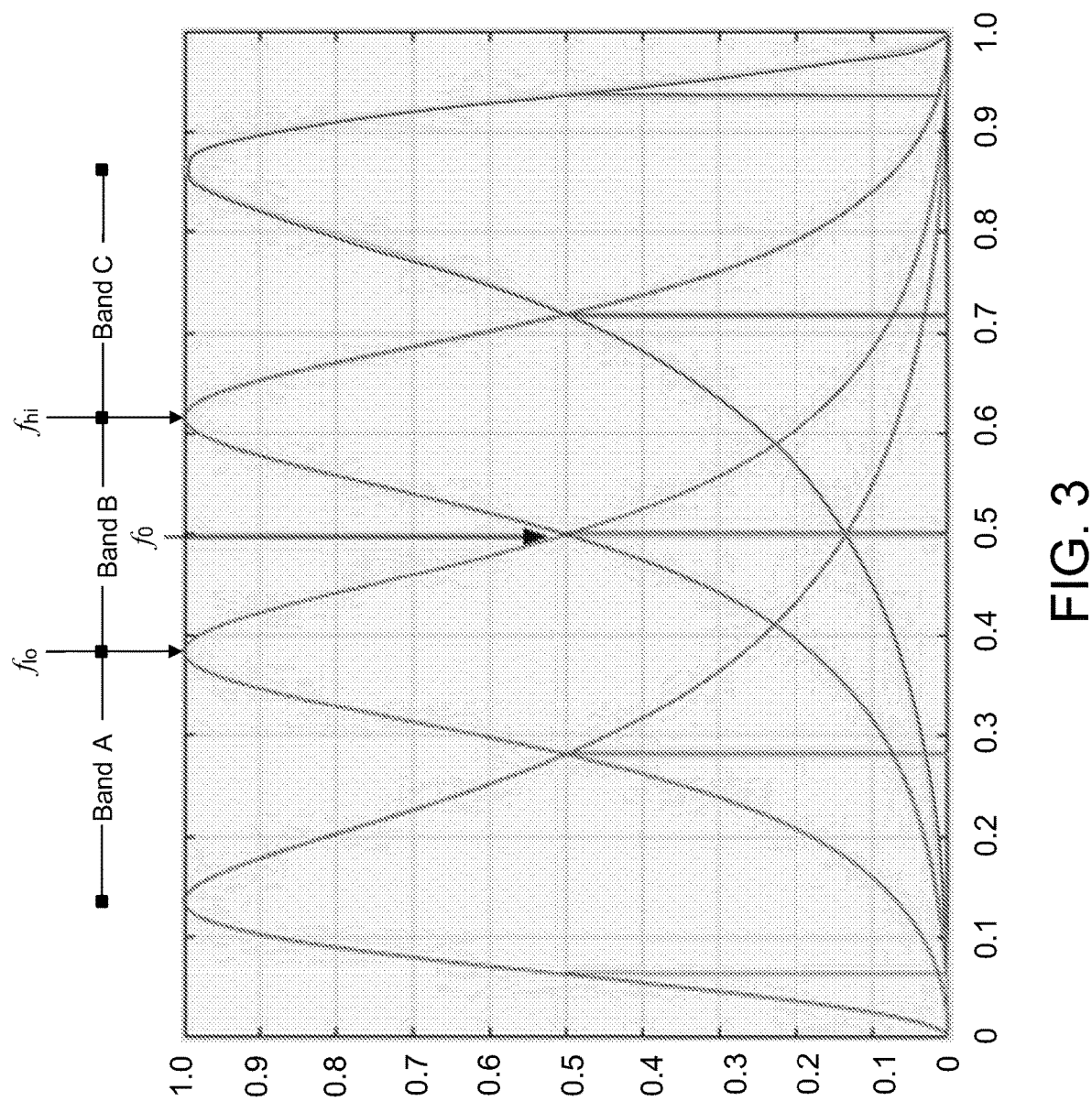
FIG. 3 is a graph showing the filter responses as a function of frequency for four consecutive fixed filters with overlapping filter responses that can monitor three bands of interest (as shown) by using each consecutive filter pair.
Figure 4:
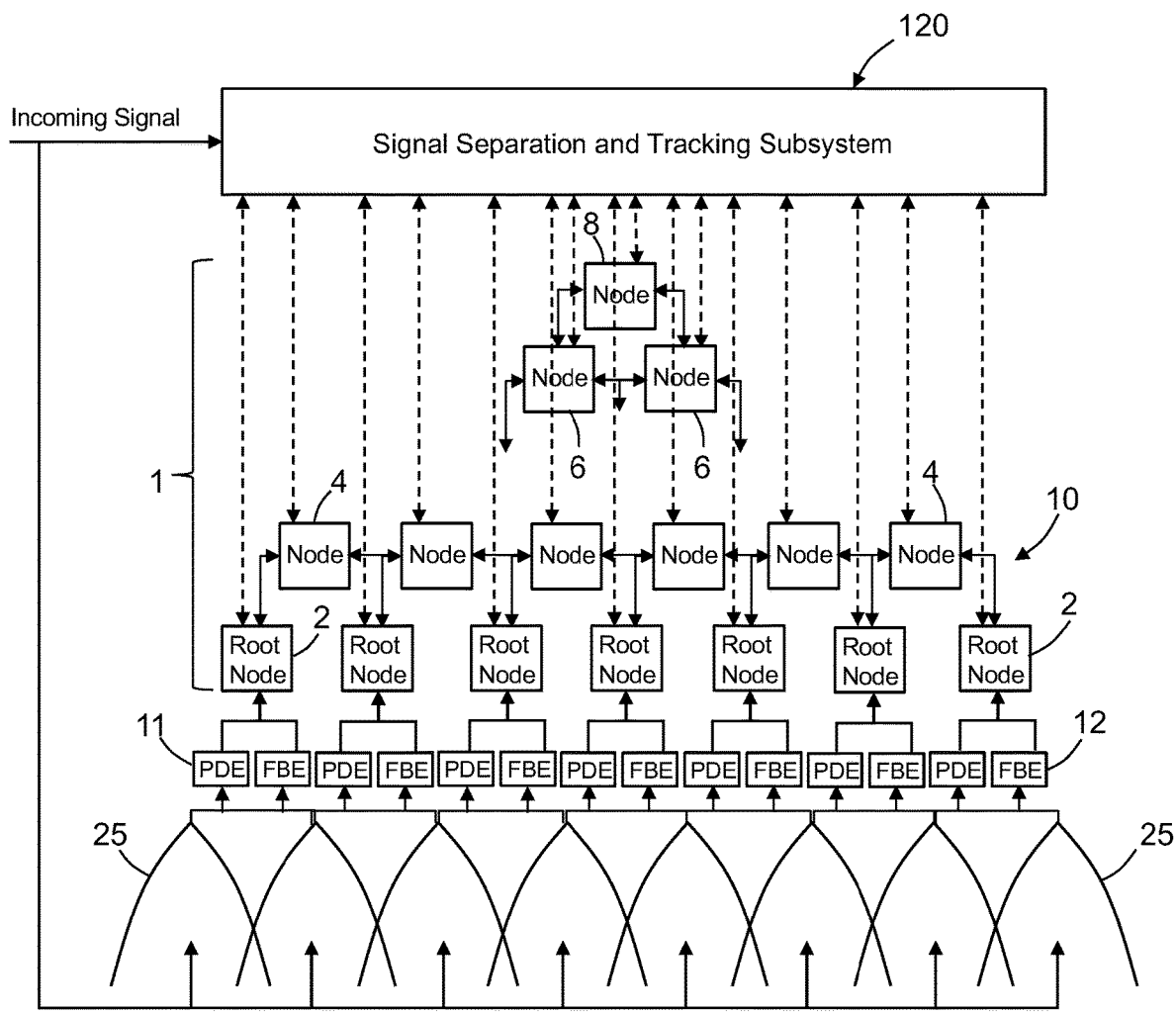
FIG. 4 is a block diagram identifying components of a cueing system in accordance with one embodiment.

The frequency and bandwidth estimation method employed in the system partly depicted in FIG. 2 requires a pair of partially overlapping fixed filters for each frequency band of interest. FIG. 3 shows the filter responses as a function of frequency for four consecutive fixed filters (hereinafter "cueing filters") with overlapping filter responses that can monitor three bands of interest (bands A, B, and C in FIG. 3) as shown, by using each consecutive filter pair. For example, a signal frequency/bandwidth estimator based on a consecutive filter pair which covers the frequency range [$f_{lo}$, $f_{hi}$], where the center frequency is $f_0$ (with amplitude response ½ in the case shown in FIG. 3), will be used in the discussion that follows. Each filter pair includes first and second fixed filters having partially overlapping bandwidths that include a frequency range bounded by lower- and upper-bound frequencies $f_{lo}$ and $f_{hi}$ and having center frequency $f_0$. The first fixed filter of the pair has a center frequency equal to the lower-bound frequency $f_{lo}$ and the second fixed filter of the pair has a center frequency equal to the upper-bound frequency $f_{hi}$. For example, signal samples may be input to first, second, and third filters having first, second, and third bandwidths respectively, wherein the first and second bandwidths are partially overlapping, the second and third bandwidths are partially overlapping, and the first and third bandwidths are not partially overlapping;

FIG. 4 is a block diagram identifying components of a cueing system 10 in accordance with one embodiment. The cueing system 10 uses an array of IIR filters that cover a wide input band of interest, together with an inverted state tree 1 of nodes. The parabolic curves in FIG. 4 represent the respective signals 25 which are passed by the IIR filter array (not shown in FIG. 4). The IIR filters are configured such that adjacent pairs of IIR filters pass signals $x_{hi}$ and $x_{lo}$ having respective frequency bands which partially overlap and have different center frequencies. Those signals are sent to a respective pre-detection estimator 11 (PDE 11 in FIG. 4) and to a respective frequency/bandwidth estimator 12 (FBE 12 in FIG. 4). Thus, each pre-detection estimator 11 and associated (paired) frequency/bandwidth estimator 12 receives signals $x_{hi}$ and $x_{lo}$ from a respective pair of adjacent high and low filters (not shown in FIG. 4, but see high filter 28 and low filter 26 in FIGS. 7 and 8).

The inverted state tree 1 consists of multiple levels of nodes, the number of nodes in each level decreasing in ascending order. Each non-root node is connected to two nodes in the level below. The first level of nodes includes root nodes 2. Each root node 2 receives data from a respective pre-detection estimator 11 and associated frequency/bandwidth estimator 12. The second level of nodes includes non-root nodes 4 (hereinafter "nodes 4"). Each node 4 receives data from two root nodes. For example, the first node 4 in the second level receives data from the first and second root nodes; the second node 4 in the second level receives data from the second and third root nodes; and so forth. Multiple intervening levels of nodes are not shown in FIG. 4. Assuming the number of levels of nodes equals N, the (N−1)-th level includes two non-root nodes 6 (hereinafter "nodes 6"), while the N-th level includes a single non-root node 8 (hereinafter "node 8"). As seen in FIG. 4, node 8 receives data from nodes 6. The vertical double-headed dashed arrows in FIG. 4 indicate that each node is communicatively coupled to the SST subsystem 120. Via this communication path, the node may send an SST channel request and channel parameters and updates to the SST subsystem 120 and receive $NOSIGNAL_C$ and $CHANNEL_C$/NOCHANNEL messages (described in more detail below) from the SST subsystem 120.

There are two main purposes for the inverted state tree 1 of nodes. One purpose is to accurately report frequency intervals to the SST subsystem 120 by joining together intervals for wider bandwidth signals that cover more than one filter pair. The other purpose is to pre-detect the presence of a signal in the reported frequency interval before requesting a tracking channel from the SST subsystem 120, thereby conserving channel resources within the SST subsystem 120.

The cueing system 10 depicted in FIG. 4 operates as follows:

Incoming signals 25 pass into the cueing filters at the bottom of FIG. 4 and filter outputs are created for each filter.

The output of each pair of adjacent filters is input to both a pre-detection estimator 11 (described in the following section entitled "Cueing Detection Method") and a frequency/bandwidth estimator 12 (described in the following section entitled "Cueing Signal Frequency/Bandwidth Estimator" with reference to FIGS. 7 and 8). The estimators input a frequency/bandwidth estimate (f, w) and a pre-detection estimate d into each root node 2. Each root node 2 has seven inputs and four outputs (except on the left and right ends which have six inputs and three outputs).

Figure 5B:
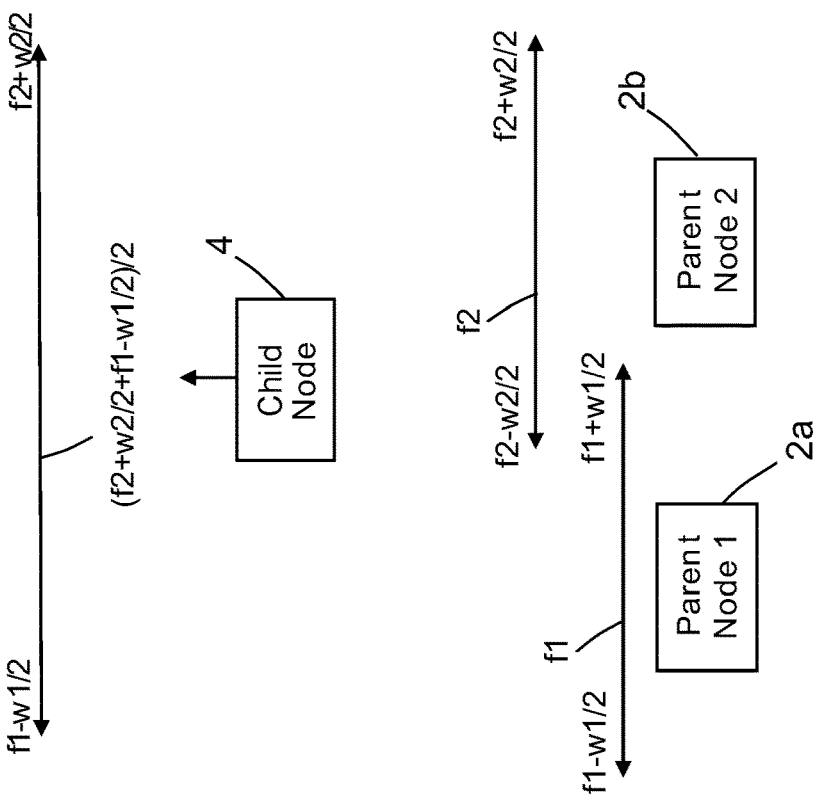
FIG. 5B is a diagram showing a pair of parent nodes which have detected respective signals that partly overlap in frequency and therefore are joined by a child node.
Figure 5A:
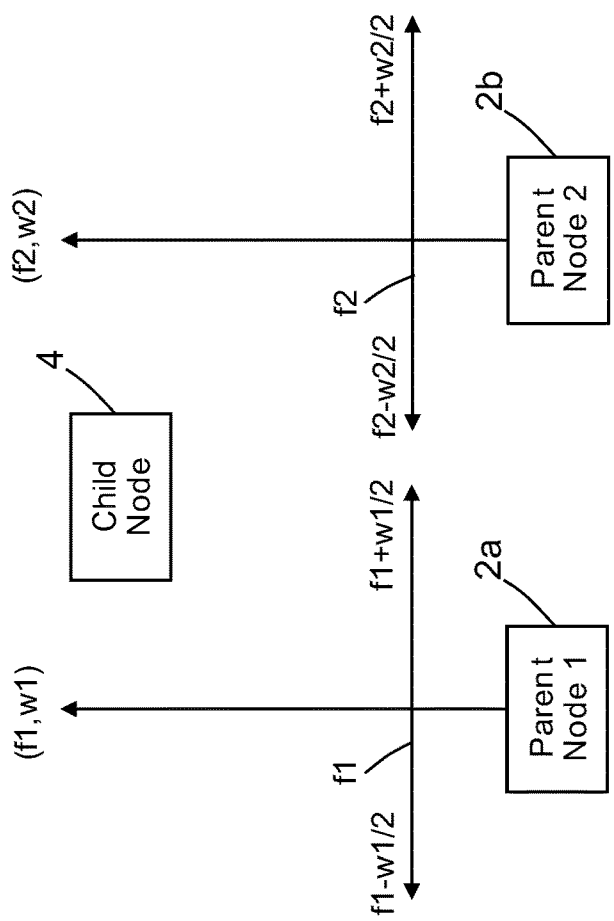
FIG. 5A is a diagram showing a pair of parent nodes which have detected respective signals that do not overlap in frequency and therefore are not joined by a child node.

The next level of nodes 4 join together (form the union of) any (f, w) intervals (which is the interval in frequency from (f−w/2) to (f+w/2), denoted by [f−w/2, f+w/2]) which are adjacent or overlapping. FIGS. 5A and 5B show examples of this joining. (For the purpose of illustration, it is assumed that the parent nodes are root nodes 2 and the child node is a non-root node 4; however, the same principles apply when the parent nodes and the child node are all non-root nodes.) As seen in FIG. 5A, if the high and low filters of a pair of adjacent filters pass respective signals having estimated bandwidths which are non-overlapping, then each parent node reports separate (f, w) values to respective SST channels. In this example, parent node #1 is outputting data representing a bandwidth (frequency interval) [$f_1−w_1/2$, $f_1+w_1/2$] having a center frequency $f_1$, while parent node #2 is outputting data representing a frequency interval $[f_2-w_2/2, f_2+w_2/2]$) having a center frequency $f_2$. Conversely, as seen in FIG. 5B, if the high and low filters pass respective signals having estimated bandwidths which are partially overlapping (or adjacent), then the parent nodes do not report (f, w) values to the SST channels. Instead the child node 4 joins the two frequency intervals and reports (f, w) values for the combined frequency interval to an SST channel. In this example, parent node #1 is outputting data representing a frequency interval $[f_1-w_1/2, f_1+w_1/2]$ having a center frequency $f_1$ and parent node #2 is outputting data representing a frequency interval $[f_2-w_2/2, f_2+w_2/2]$ having a center frequency $f_2$, which causes node 4 to output data representing a frequency interval $[f-w_1/2, f+w_2/2]$ having a center frequency $(f_2+w_2/2+f_1-w_1/2)$. If higher nodes have no further interval joining, requests for an available SST channel are sent. If an SST channel is made available, parameters and updates including frequency and bandwidth are passed to each channel which is made available. This next level and subsequent ones up to one level below the top node have six inputs and six outputs (except for the left and right nodes which have five inputs and five outputs).

Further levels of nodes continue this process of joining frequency intervals together and sending requests as described above, all the way to the top-level node 8. The top level node 8 only has four inputs and four outputs.

The details of the process that occurs in each tree node is described as a state machine in the following section entitled "Tree Node State Machine".

Tree Node Description

Each tree node has the job of joining together signal frequency and bandwidth results from nodes below and sending information to nodes above and below to produce final frequency and bandwidth estimates for both narrow and wideband signals and request the signal separation and tracking be started, as shown in FIG. 4. For example, if the two parent nodes below report signals with bandwidth W and adjacent frequency intervals, the current node would infer that the signal actually has twice the bandwidth 2W with center frequency halfway between the two. The operation of each tree node (root and non-root) is best described by a state machine diagram.

Figure 6:
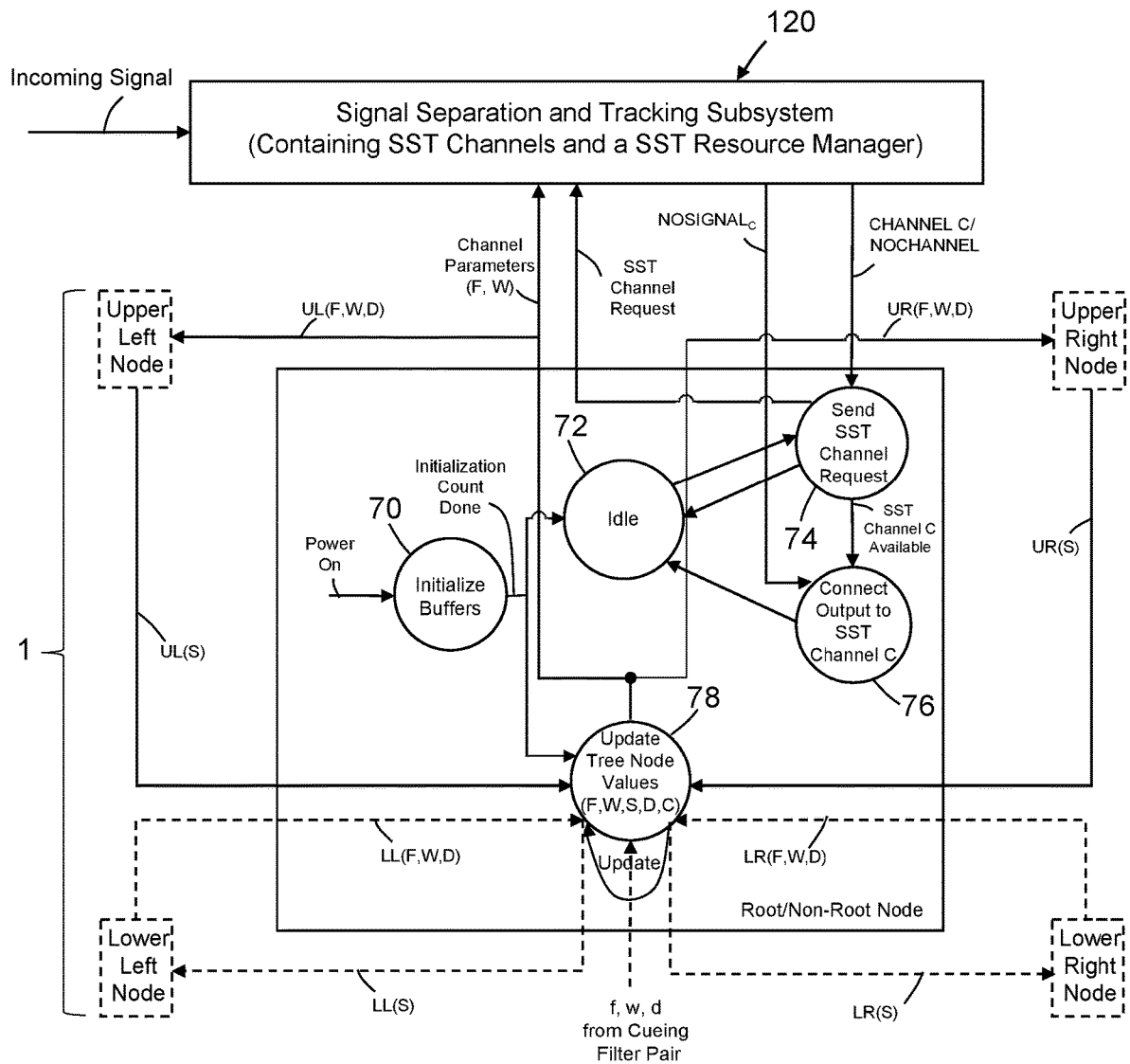
FIG. 6 is a tree node diagram identifying the states, inputs and outputs of a node in an IIR filter array with inverted state tree in accordance with one proposed implementation.

FIG. 6 shows such a state diagram together with the inputs and outputs of a node. This state diagram is applicable to both root nodes and non-root nodes. If the center node is assumed to be a root node, then the lower left and right nodes would not be present. If the center node is assumed to be the single top-level non-root node, then the upper left and right nodes would not be present. If the center node is assumed to be a non-root node on the second level, then only one upper node (the top-level non-root node) would be present.

Assuming that the central node depicted in FIG. 6 is a root node, then the seven inputs of the root node are the following:

Three inputs from below: the estimates for frequency f and bandwidth w from the frequency/bandwidth estimator 12 and the estimate for pre-detection metric d from the pre-detection metric estimator 11. These form the basic frequency intervals that the inverted state tree 1 uses to infer the final joined frequency intervals.

Two signals from above: the $NOSIGNAL_C$ from the tracking SST channel and the $CHANNEL_C$/NOCHANNEL signal from the SST system. $NOSIGNAL_C$ is sent by the C channel of the SST system to indicate that a signal has gone away. The $CHANNEL_C$/NOCHANNEL signal is sent back to the requesting cueing node to indicate that either channel C is available for tracking or no channel is available.

Two status states from the upper left and right nodes: UL(S) and UR(S): These are used to prevent the current node from requesting an SST channel if an upper node is doing the requesting.

The four outputs of the root node are the following:

Two outputs of frequency, bandwidth, and pre-detection metric state values (F, W, D) to the nodes above and to the left and right, denoted by UL(F, W, D) and UR(F, W, D). The upper nodes use these values to join together frequency intervals if needed.

An SST Channel Request to the SST system. This is sent if a signal is present in the current frequency interval and no upper nodes have prevented it.

State values (F, W) to channel C of the SST system to initiate tracking. This is sent if a $CHANNEL_C$ available signal has been received previously.

Assuming that the central node depicted in FIG. 6 is a non-root node on the third level or lower, the six inputs of a non-root node are the following:

Two inputs from the lower left and right nodes containing their state values LL(F, W, D) and LR(F, W, D).

Two signals from above: the $NOSIGNAL_C$ signal from the tracking SST channel and the $CHANNEL_C$/NOCHANNEL signal from the SST system.

Two status states from the upper left and right nodes: UL(S) and UR(S).

The six outputs of the non-root node are the following:

Two outputs of frequency, bandwidth, and pre-detection metric state values (F, W, D) to the nodes above and to the left and right, denoted by UL(F, W, D) and UR(F, W, D).

Two outputs of the current node status S to the nodes below and to the left and right, denoted by LL(S) and LR(S).

An SST Channel Request to the SST system.

State values (F, W) to channel C of the SST system to initiate tracking.

Finally, note that the first and last nodes on each level have fewer inputs and outputs than is listed here due to no node existing to the left or right. Also, the highest node has fewer inputs and outputs. The next section describes what happens in each state to produce these inputs and outputs.

Tree Node State Machine

Figure 6A:
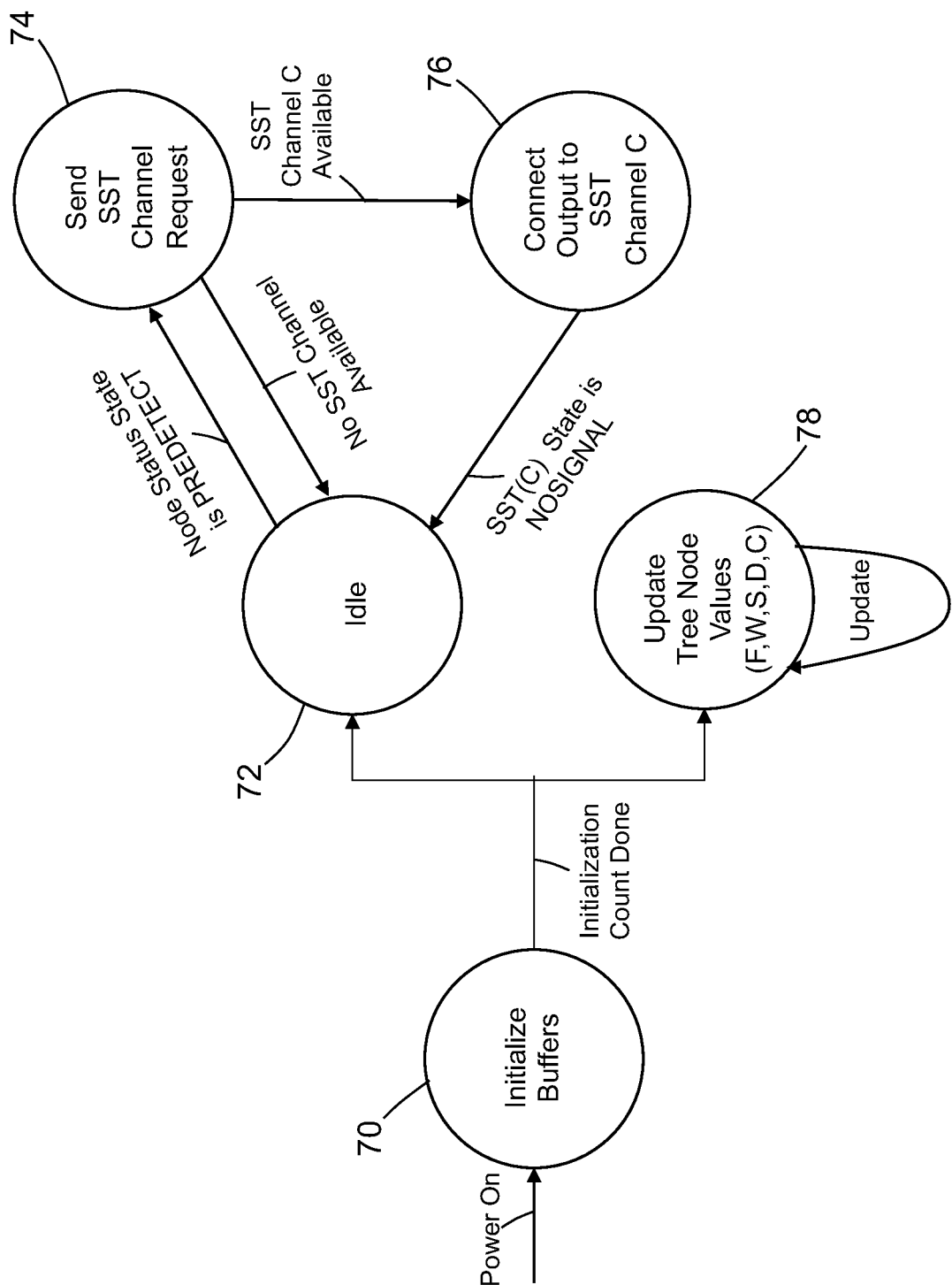
FIG. 6A is a state diagram showing on a magnified scale the states and state transitions inside the node depicted in FIG. 6.

Each node has five states and the following internal state vector with state values (F, W, D, S, C). The states are as follows: (1) Power on/Initialize buffers; (2) Update Tree Node Values state; (3) Idle state; (4) Request SST Channel state; and (5) Connect Output to SST Channel state. The state machine generally moves through the state machine in the order (1)→(2)→(2) . . . and (1)→(3)→(4)→(5)→(3) . . . as shown on a magnified scale in FIG. 6A. Each of these state transitions is described in detail below, along with how the state values are updated.

1. Power On/Initialize Buffers. The buffers and registers in the various parts of each tree node are initialized at power-on, including setting all the status values to NOPREDETECT. Then the state transitions to both Idle and Update tree node values.

2. Update Tree Node Values State. This state always runs after power up and continuously updates the state values (F, W, D, S, C). Using the tree node notation, each tree node takes in the state values from the low LL(F, W, D) and high LR(F, W, D) parent nodes (or f, w, d if it is the root node) below in the inverted tree structure and the status in the child nodes above denoted by UL(S) and UR(S).

(a) First, how the root nodes get updated is explained. In this case, the state values (F, W) are set to the outputs of the learned filter response described in the following section entitled "Cueing Signal Frequency/Bandwidth Estimator". Similarly, the pre-detection state D is set to the cueing detection estimate $d(x_{lo}, x_{hi})$ described in the following section entitled "Cueing Detection Method". Also, the status S is set based on the threshold $D_{pd} = D_{pd}(x_{lo}, x_{hi})$ and the status from the upper nodes UL(S) and UR(S). Specifically if both UL(S) and UR(S) are NOPREDETECT, then if $d < D_{pd}(x_{lo}, x_{hi})$ and both UL(S) and UR(S) are NOPREDETECT, the root node sets S to NOPREDETECT, and otherwise the root node sets S to PREDETECT. Otherwise, if either UL(S) or UR(S) is PREDETECT, then S is set to NOPREDETECT.

(b) Next, how the non-root nodes get updated is explained. In this case, the state values (F, W, D) are set by joining the two frequency intervals from LL(F, W, D) and LR(F, W, D) based on whether the intervals from LL(F, W) and LR(F, W) are adjacent (also overlap as seen in FIG. 5A) or disjoint (as seen in FIG. 5B) and what the pre-detection metric state values LL(D) and LR(D) are. Specifically, the non-root node forms new state values (F', W', D') as in FIG. 5B if the intervals can be joined and if $$D_0 = (LL(D) + LR(D))/2 > D_{pd}.$$

In FIGS. 5A and 5B, the notation (f1, w1)=LL(F, W) and (f2, w2)=LR(F, W) is used. Otherwise, the state values (F, W, D) are left blank. Similarly, the status S is NOPREDETECT unless the frequency intervals are joined, and the status is set based on the status from the upper nodes UL(S) and UR(S). Specifically if both UL(S) and UR(S) are NOPREDETECT, then S is set to PREDETECT. Otherwise, if either UL(S) or UR(S) are PREDETECT, then S is set to NOPREDETECT. The non-root node has two additional state outputs to the nodes below left and right called LL(S) and LR(S) that get updated based on the current status S.

3. Idle State. The Idle state simply waits for the tree state node status S to change to PREDETECT and then transitions to the Send SST Channel Request state.

4. Send SST Channel Request State. A request is sent to the SST resource manager (which is a module within the SST controller 126 identified in FIG. 1) requesting an available SST channel 20 for processing a detected signal. Either a channel identifier C is returned or no channel is available. In the first case, the state transitions to the Connect Output to SST Channel state and the current channel C is set in the state vector. In the second case, the state transitions back to the Idle state.

5. Connect Output to SST Channel State. The state values (F, W) are passed to SST channel C as the frequency and bandwidth settings for tuning its tracking filter and the incoming digital signal is connected to the input of the SST channel C tracking filter. When the SST channel goes into a NOSIGNAL state (in other words, it is in its SST Idle state for a given amount of time), the state transitions back to the Idle state with S=NOPREDETECT and C is set back to 0, indicating no channel in use.

Cueing Detection Method

Cueing detection is a pre-detection step that is used to reduce the usage of the limited SST channels available. While the SST channel produces the actual detection decision through a SIGNAL or NOSIGNAL value, the pre-detection step must be used in order to generate this value.

If every cueing filter simply used a SST channel all the time, this would reduce their availability since there would likely be more cueing filters than SST channels. In order to reduce their usage, a pre-detection step is used. This works as follows:

The pre-detection metric $d(x_{lo}, x_{hi}) = d = |x_{lo} - x_{hi}|_W / (x_{lo} + x_{hi})_W$ (written in vector form) is computed at every filter update at each tree node in the Update Tree Node Values state. This is shorthand for the following computation:

$$d = \left( \sum_{i \in W} |(x_{lo}(i) - x_{hi}(i))(x_{lo}(i) + x_{hi}(i))| \right) \Big/ \left( \sum_{i \in W} (x_{lo}(i) + x_{hi}(i))^2 \right)$$

The pre-detection metric d measures a normalized signal energy by dividing the sum of the energy differences between the outputs of the low and high filter pair (the difference between the signal energies) by the sum of the energies of those outputs (the sum of the signal energies). During the Idle state, the pre-detection metric d is compared to the learned metric $D_{pd}(x_{lo}, x_{hi})$ to determine whether $d < D_{pd}(x_{lo}, x_{hi})$ or not. A computer simulation is used to set this value based on the desired probability of detection ($P_d$) (see FIGS. 9 and 10). If the pre-detection metric d meets this test, a cueing pre-detection labeled PREDETECT is declared and an SST channel is requested; otherwise NOPREDETECT is declared and no SST channel request is sent.

The learned metric $D_{pd}(x_{lo}, x_{hi})$ is stored in a 2-D interpolating lookup table. The metric can be learned by simulating a pair of filtered signals within a grid of frequencies and bandwidth in various levels of noise at a given probability of detection ($P_d$=0.9 for example).

Figure 9:
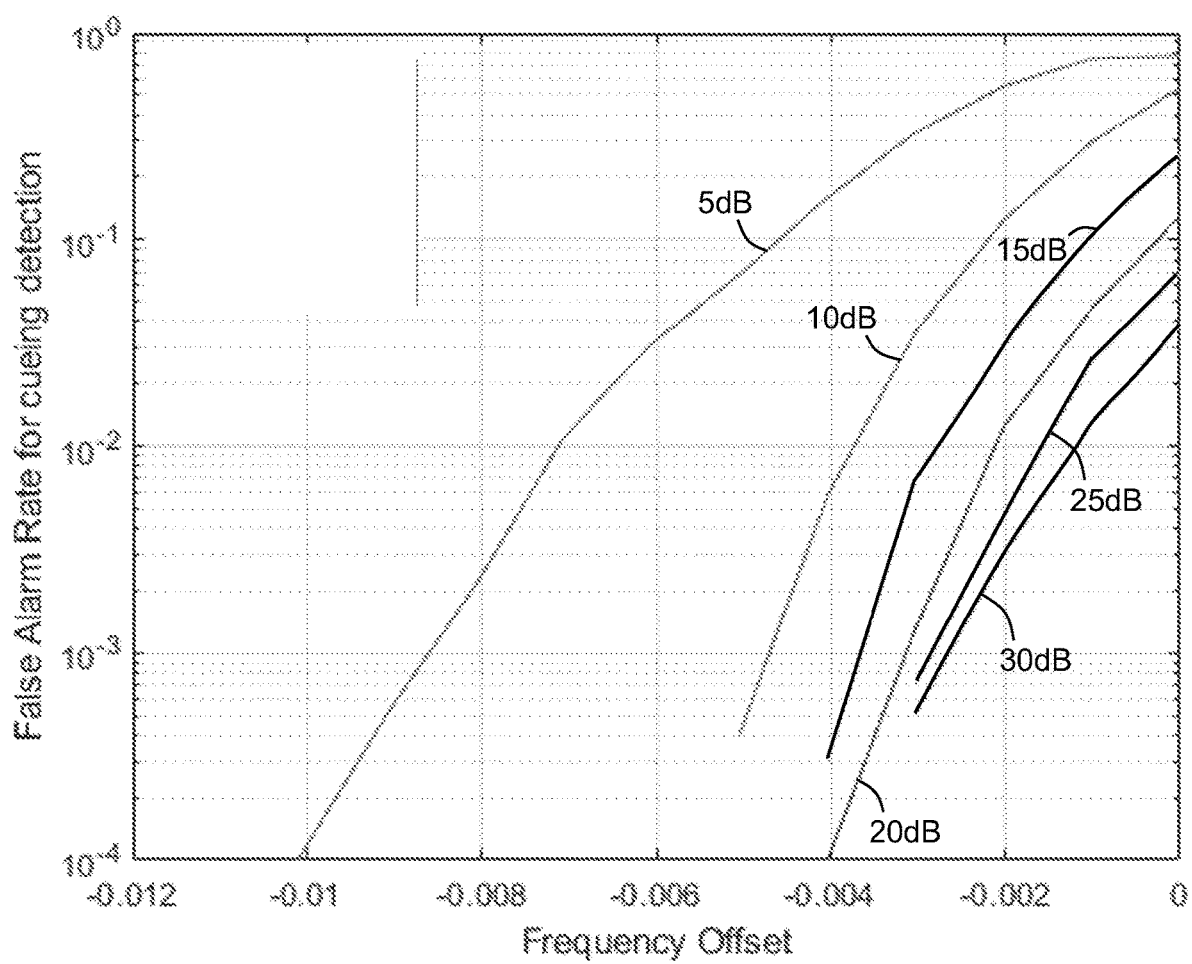
FIG. 9 is a graph showing the false alarm performance of a pre-detection (cueing) metric for pairs of filters having different signal-to-noise ratios (SNRs) in a simulation wherein the probability of detection was equal to 90% and the bandwidth was 0.01.
Figure 10:
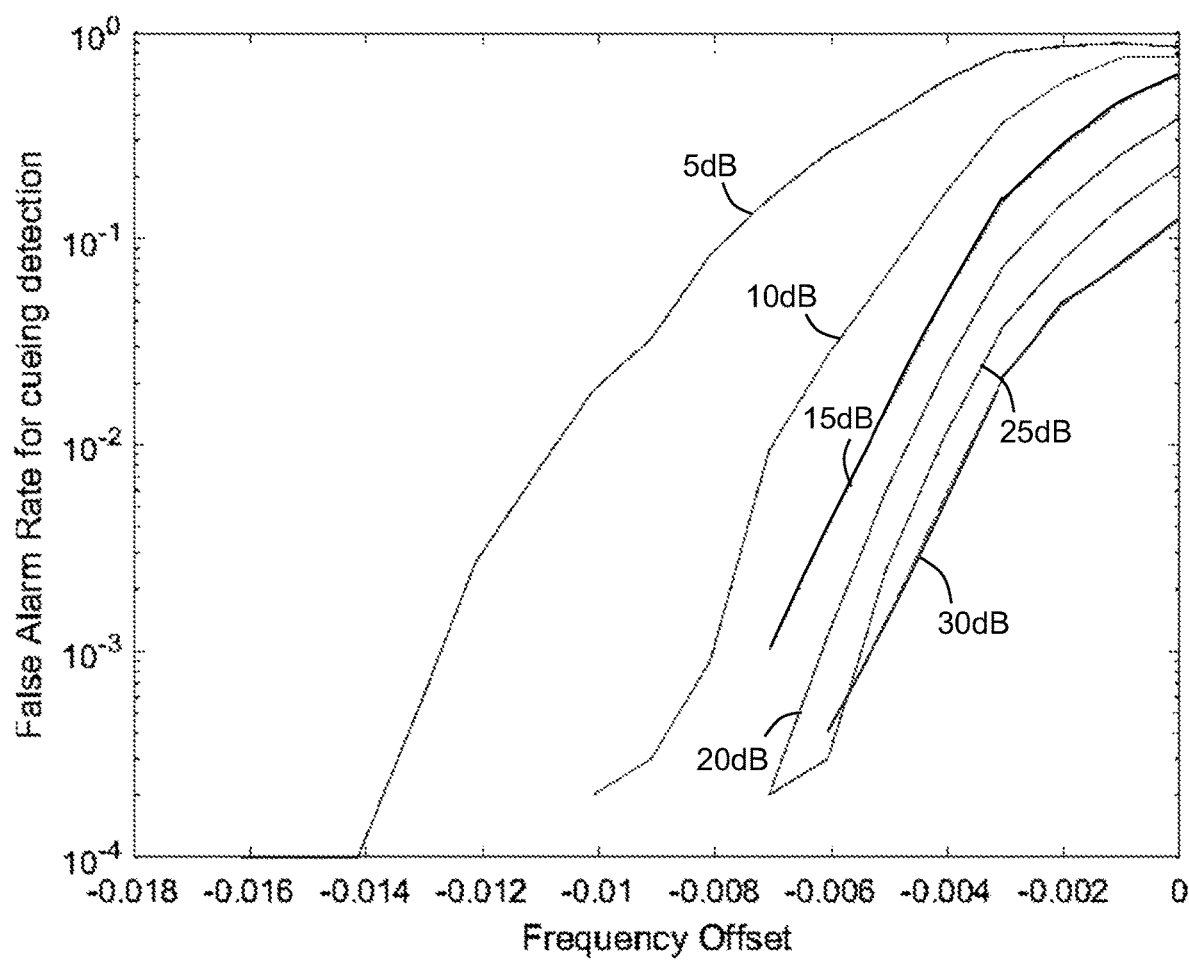
FIG. 10 is a graph showing the false alarm performance of a pre-detection (cueing) metric for pairs of filters having different SNRs in a simulation wherein the probability of detection was equal to 90% and the bandwidth was 0.1.

FIGS. 9 and 10 show the performance of this metric as a function of frequency offset and SNR for two bandwidth cases: BW=0.01 (FIG. 9) and BW=0.1 (FIG. 10). Clearly, except for small frequency offsets near 0 (where the two filters have similar responses and thus are hard to distinguish from noise), the false alarm probability is very small (indicating that except for a small percentage of time, the request for a SST channel is actually needed) and the signal bandwidth has very little effect. Thus, the usage of the SST channel resource is managed very directly and efficiently using the learned metric $D_{pd}(x_{lo}, x_{hi})$.

Cueing Signal Frequency/Bandwidth Estimator

Figure 7:
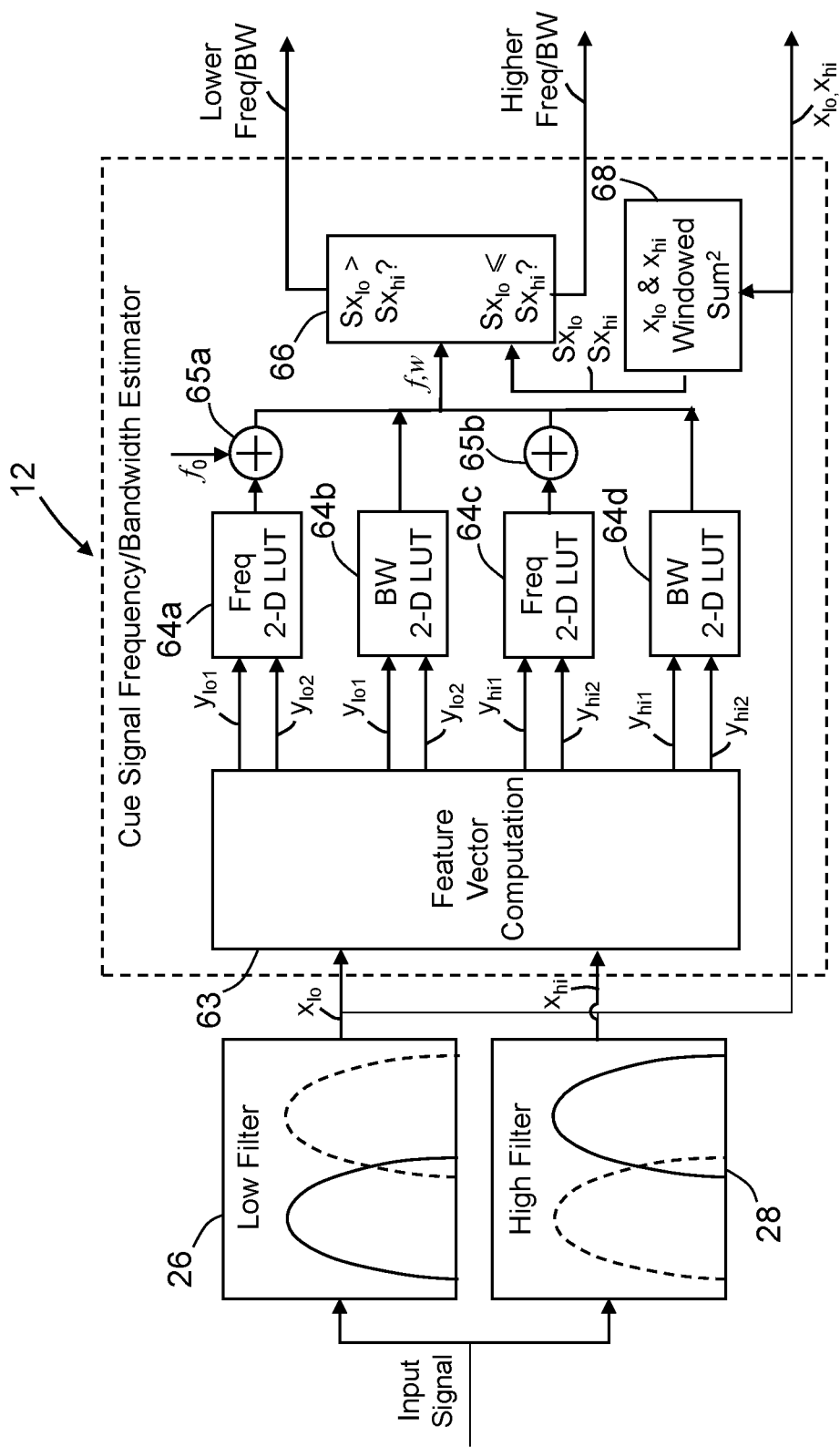
FIG. 7 is a diagram representing both functions of a process and functional modules of electronic circuitry which are configured to perform frequency and bandwidth estimation of signals output by a pair of overlapping fixed filters.

FIG. 7 is a diagram representing both functions of a process and functional modules of electronic circuitry which is configured to perform frequency and bandwidth estimation of signals output by a pair of overlapping fixed filters. The overlapping fixed filters include a low filter 26 and a high filter 28. The functions of the process identified in FIG. 7 are performed by electronic circuitry configured as data processing modules and lookup tables. The digital data is processed in a streamlined manner as indicated by arrows in FIG. 7. From left to right, the steps of the process in accordance with one proposed implementation are as follows:

1. The low filter 26 and high filter 28 produce respective outputs at every incoming sample, where $x_{lo}$ is the output of the low filter 26 and $x_{hi}$ is the output of the high filter 28.

2. The filter outputs $x_{lo}$ and $x_{hi}$ are fed into a feature vector computation module 63 which produces four feature vectors: $y_{lo1}$ and $y_{lo2}$ are the two low-filter feature vectors (to be used when the signal is estimated to have a center frequency less than $f_0$). Similarly, $y_{hi1}$ and $y_{hi2}$ are the two high-filter feature vectors (to be used when the signal is estimated to have a center frequency more than $f_0$).

3. Then pairs of the feature vectors go into four 2-D interpolating lookup tables 64a-64d which have been trained through a machine learning process to provide best estimators of frequency offset and bandwidth. More specifically, feature vectors $y_{lo1}$ and $y_{lo2}$ are input to frequency offset lookup table 64a and bandwidth lookup tables 64b; while feature vectors $y_{hi1}$ and $y_{hi2}$ are input to frequency offset lookup table 64c and bandwidth lookup table 64d. As a result, frequency offset and bandwidth estimates for the frequency range [$f_{lo}$, $f_0$] are read out from frequency offset and bandwidth lookup tables 64a and 64b respectively; while frequency offset and bandwidth estimates for the frequency range [$f_0$, $f_{hi}$] are read out from frequency offset and bandwidth interpolating lookup tables 64c and 64d respectively. Each lookup table (LUT) produces an interpolated frequency offset and then a respective post-LUT adder 65a-65d adds the center frequency $f_0$ for each LUT to produce the final frequency estimate f.

4. The four output values corresponding to the lower and higher frequency and bandwidth estimates go into a decision process 66 that selects and reports a final frequency and bandwidth estimate depending on whether a windowed sum squared of the output of the low filter 26 (designated $Sx_{lo}$ in FIG. 7) is less or more than the windowed sum squared of the output of the high filter 28 (designated $Sx_{hi}$ in FIG. 7) (step 68).

The feature vector computation module 63 is configured to compute the aforementioned feature vectors. More specifically, electronic circuitry is configured to compute feature vectors in accordance with the process 30 depicted in FIG. 8. The operations of process 30 are first explained mathematically and then described in more detail.

If $x_{lo}$ is the output of the low filter $F_{lo}$ and $x_{hi}$ is the output of the high filter $F_{hi}$, one may compute a pair of features (or parameters) ($y_{lo1}$, $y_{lo2}$) associated with the frequency range [$f_{lo}$, $f_0$] and a pair of features (or parameters) ($x_{hi1}$, $x_{hi2}$) associated with the frequency range [$f_0$, $f_{hi}$] and then choose the best pair for estimation. The purpose of this split at the center frequency $f_0$ is to help with creating a grid of points so that learning the frequency offset $\Delta f$ and bandwidth w estimates from these parameters is robust with respect to noise. Note that when the frequency offset $\Delta f$ from the center frequency $f_0$ is estimated, one can then estimate the true frequency using $f_0+\Delta f$.

The process of learning $\Delta f$ and w from the feature vectors can be done in different ways. One common method uses neural networks which have layers of linear combiners followed by non-linear elements. The learning takes place by generating a training set of data to find the linear combiner coefficients so that when two feature vectors are input, the resulting output of estimated $\Delta f$ and w is accurate. Essentially, this learning is a means to interpolate an unknown nonlinear function in two dimensions by generating many example values that cover the range of the input and output. However, since one needs to both create a very low latency interpolation method and use resources effectively in an implementation such as an FPGA, an alternative learning method is used whereby a training set of data is generated and then a 2-D grid is imposed on the data with output values assigned to each grid element. This grid is then stored in a lookup table and the output of the lookup table is then interpolated using a linear interpolation in two dimensions. This creates a low latency method to give frequency and bandwidth estimates directly from filter pair outputs. In accordance with one proposed implementation, the 2-D interpolating lookup table may be implemented using block random access memory elements in an ASIC or a FPGA.

If these features on plotted on a graph where each grid point indicates a particular generated signal of a known frequency and bandwidth, a pair of distorted nonlinear 2-D grids would be created. Overlaid on these grids are contours showing both frequency offset and bandwidths. By creating a 2-D lookup table with interpolation for frequency offset and a 2-D lookup table with interpolation for bandwidth, the system has in effect learned an approximation that takes filter values and produces important parameters of interest.

Next, the concepts underlying the feature vectors will be described. The basic idea is to create simply computed independent features that are roughly related to the parameters of interest (namely center frequency and bandwidth) and then use machine learning to make a more direct connection to those parameters. As described in more detail below, the second features ($y_{lo2}$, $y_{hi2}$) are produced by the windowed sum of the product of the two filtered signals ($x_{lo}$, $x_{hi}$) divided by the windowed sum of the squared sum of their amplitudes. This is then related to a measure of frequency offset because it is essentially the least square solution of the best scalar estimate of $\pm(x_{hi}-x_{lo})/(x_{hi}+x_{lo})$, which essentially measures the overall normalized difference in time between the two signals and this in turn is related to their frequency difference since the closer they are in frequency, the closer this normalized difference is to zero.

The first features ($y_{lo1}$, $y_{hi1}$) are based on creating a complex signal from the low filter and a complex signal from the high filter through an approximate I, Q process. However, instead of mixing against a sine and cosine of the appropriate center frequency (as the I, Q process would do), a simple interpolated delay is used, based on the center frequency $f_0$ of the filter pair. Then each of the two complex signals is inverted and mixed against the other. This creates two complex signals that represent roughly their low-to-high frequency difference and their high-to-low frequency difference. Then the second feature is subtracted/added so that a rough frequency difference is zeroed out. Thus, these complex signals should essentially be nearly constant (and have nearly zero variance) if a zero bandwidth single tone is present. By contrast, when wider bandwidth signals are present, the variance (or standard deviation) of these complex signals is then related to a measure of bandwidth.

Note that these features are not directly frequency offset and bandwidth; that is where the learning takes place through feature generation that trains interpolating lookup tables. Mathematically, the feature vector formation process may be described as follows. First, the construction of a complex signal is approximated through simple delays and interpolation, leading to the complex mixed signal $$z = (x_{lo} + i\widehat{x_{lo}})/(x_{hi} + i\widehat{x_{hi}}) \tag{1}$$

where $$\widehat{x_{lo}}(n) = (1-r)x_{lo}(n-d) + rx_{lo}(n-d+1) \tag{2}$$

and similarly for $\widehat{x_{hi}}$. Here $$r = \text{rem}\left(\frac{1}{f_0}, 1\right)$$

and $$d = \left\lfloor \frac{1}{f_0} \right\rfloor$$

and all frequencies are in normalized form from 0 to 1. Also $$y_{lo2} = \Sigma_W(x_{hi}x_{lo})/\Sigma_W(x_{hi}^2 + x_{lo}^2) \quad (3)$$

Then $$y_{lo1} = std_W(\text{real}(z)) + std_W(\text{imag}(z)) + y_{lo2} \quad (4)$$

where the function "std" denotes the standard deviation of the sample within a sliding time window W. In a similar manner, the parameters ($y_{hi1}$, $y_{hi2}$) may be defined by switching the roles of $x_{hi}$ and $x_{lo}$ in Eqs. (1)-(4).

The step-by-step process shown FIG. 8 will now be explained described in more detail:

1. The inputs to the process are the outputs $x_{lo}$ and $x_{hi}$ from the low and high filters.

2. An approximate complex baseband version of each signal is created (($x_{lo}$+i $\widehat{x_{lo}}$) and ($x_{hi}$+i $\widehat{x_{hi}}$)) before inversion and complex multiplication. The imaginary part must be created from a delayed and interpolated version of the original signal as given in Eq. (2) for the low channel. Here delay $nf_0$ is the number of sample delays represented by d and the other delay is a single sample delay.

3. Each low and high filter channel has an approximate complex signal having real and imaginary parts which are sent along lines labeled "real" and "imag" that lead to each of the complex multipliers 36 and 56.

(a) The complex signal is sent to a complex multiplier which multiplies it with the complex inverse of the other channel.

(b) The complex signal is sent to a complex inverse lookup table 37 or 57 to compute the complex inverse that is used by the complex multiplier in the opposite channel.

(c) The real part of the complex signal (the original filter output) is sent to a squaring circuit 38 or 58 and then summed over a window of samples to produce $E_W(x_{hi}^2 + x_{lo}^2)$.

(d) Lastly, the original real signals $x_{lo}$ and $x_{hi}$ are also sent to a multiplier 44 and then window summed to produce $E_W(x_{hi}x_{lo})$ before computing the final ratio for the outputs $y_{lo2}$ and $y_{hi2}$ (where the sign is inverted).

4. Then the real and imaginary parts of the two complex channels ($x_{lo}$+i $\widehat{x_{lo}}$)/($x_{hi}$+i $\widehat{x_{hi}}$) and ($x_{hi}$+i $\widehat{x_{hi}}$)/($x_{lo}$+i $\widehat{x_{lo}}$) have their standard deviations computed in a windowed fashion and summed before outputting viol and $y_{hi1}$.

Figure 8:
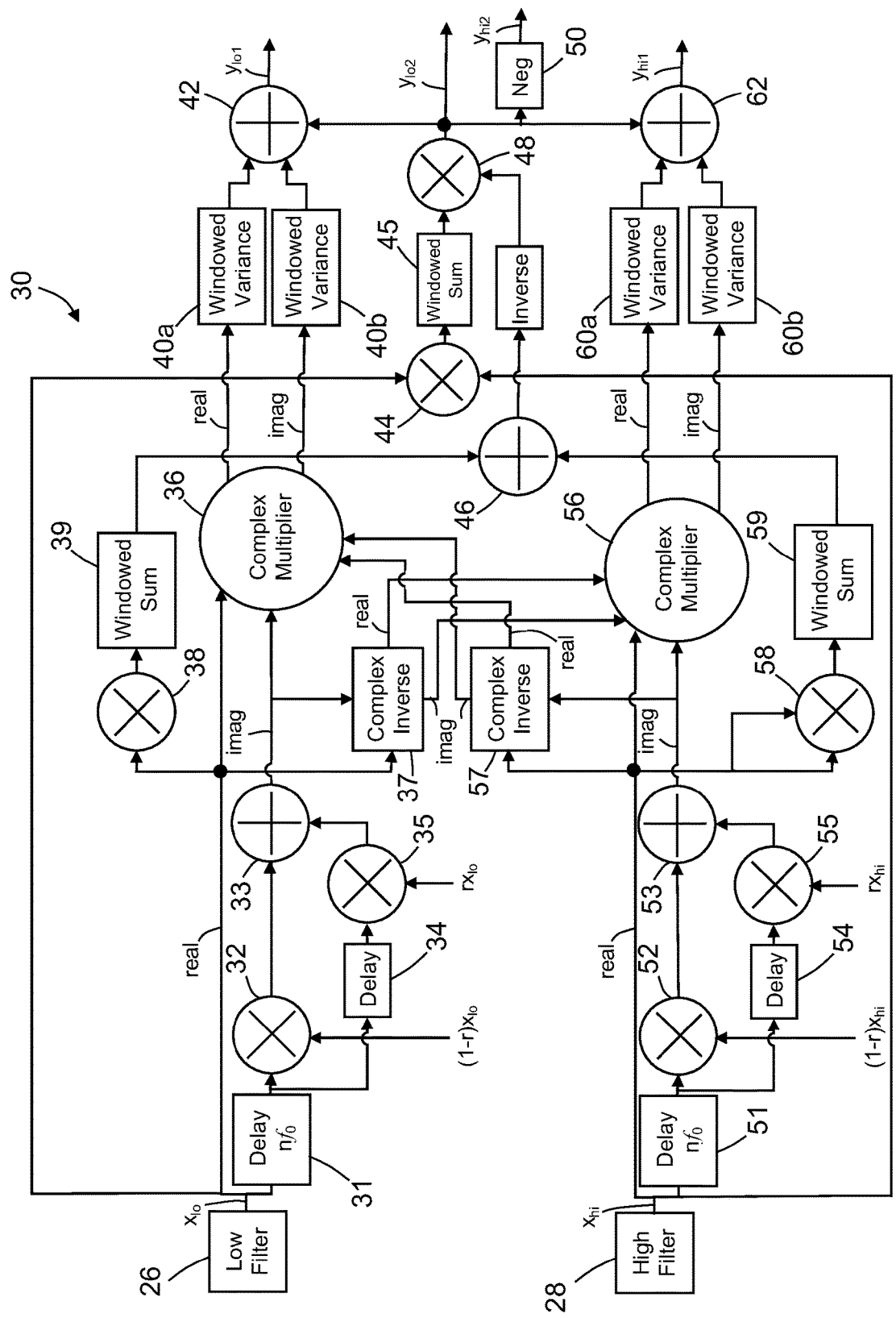
FIG. 8 is a flowchart identifying steps (signal processing operations) of a method for cueing frequency and bandwidth estimation in accordance with one proposed implementation.

To comply with the requirement that all numbered elements in a drawing be described in the specification, the following more detailed description of the methodology depicted in FIG. 8 is provided.

The low filter output $x_{lo}$ is processed in five different ways. First, the low filter output $x_{lo}$ is the real part input to a complex multiplier 36. Second, the low filter output $x_{lo}$ is delayed by a time $nf_0$ (step 31), which delayed value is further processed (as explained below) to produce the complex part which is input to complex multiplier 36. Third, the amplitude of the low filter output $x_{lo}$ is squared by the squaring circuit 38. Fourth, the low filter output $x_{lo}$ is mixed with the high filter output $x_{hi}$ to from their product (step 44). Fifth, the low filter output $x_{lo}$ is input to the complex inversion lookup table 37.

The delayed low filter output $x_{lo}$ is processed in two ways to derive an imaginary part. First, the delayed low filter output $x_{lo}$ is mixed with parameter (1−r)$x_{lo}$ (step 32) Second, the delayed low filter output $x_{lo}$ is further delayed (step 34), which further delayed value is mixed with parameter $rx_{lo}$ (step 35). The results of mixing steps 32 and 35 are then summed (step 33) to form an imaginary part which is sent to complex multiplier 36. The real and imaginary parts are also complex inverted by the complex inversion lookup table 37 and sent to complex multiplier 56.

The complex multiplier 36 outputs real and complex parts of a complex number (see Eq. (1)). Those real and imaginary parts are respectively received by windowed variance circuits 40a and 40b, which compute the standard deviation of the samples within a sliding window (see Eq. (4)).

Likewise, the high filter output $x_{hi}$ is processed in five different ways. First, the high filter output $x_{hi}$ is the real part input to the complex multiplier 56. Second, the high filter output $x_{hi}$ is delayed by a time $nf_0$ (step 51), which delayed value is further processed (as explained below) to produce a complex part which is input to complex multiplier 56. Third, the high filter output $x_{hi}$ is squared by the squaring circuit 58. Fourth, the high filter output $x_{hi}$ is mixed with the low filter output $x_{hi}$ to from their product (step 44). Fifth, the high filter output $x_{hi}$ is input to the complex inversion lookup table 57.

The delayed high filter output $x_{hi}$ is processed in two ways to derive an imaginary part. First, the delayed high filter output $x_{hi}$ is mixed with parameter (1−r)$x_{hi}$ (step 52). Second, the delayed high filter output $x_{hi}$ is further delayed (step 54), which further delayed value is mixed with parameter $rx_{hi}$ (step 55). The results of mixing steps 52 and 55 are then summed (step 53) to form an imaginary part which is sent to complex multiplier 56. The real and imaginary parts are also complex inverted by the complex inversion lookup table 57 and sent to complex multiplier 36.

The complex multiplier 56 outputs real and complex parts of a complex number. Those real and imaginary parts are respectively received by windowed variance circuits 60a and 60b, which compute the standard deviation of the samples within a sliding window.

Still referring to FIG. 8, it can be seen that the low filter output $x_{lo}$ and the high filter output $x_{hi}$ are mixed (step 44), while squaring circuit 38 forms the square of the amplitude of low filter output $x_{lo}$ and squaring circuit 58 forms the square of the amplitude high filter output $x_{hi}$. The outputs of windowed sum circuits 39 and 59 are summed (step 46) and then inverted (step 47). The outputs of the mixer that performs step 44 and the inverter that performs step 47 are then mixed (step 48) to form parameter $y_{lo2}$ (see Eq. (3)). The windowed variances output by windowed variance circuits 40a and 40b and the parameter $y_{lo2}$ are summed (step 42) to form the parameter $y_{lo1}$. The windowed variances output by windowed variance circuits 60a and 60b and the parameter $y_{lo2}$ are summed (step 62) to form the parameter $y_{hi1}$. The sign of parameter $y_{lo2}$ is reversed (step 50) to form the parameter $y_{hi2}$.

Signal Tracking Lookup Table for Filter Coefficients

A tunable filter, such as the tracking filter in an SST channel, requires updating filter coefficients. To do this quickly, a lookup table method is required. U.S. Pat. No. 9,954,561 discloses an embodiment in which the filter module implements an interpolation process to enable determination of the final values of filter coefficients α and β to provide the updates within two hardware clock cycles. The updated center frequency and bandwidth signal contained at least one of a frequency word and a bandwidth word including a frequency value and a bandwidth value, respectively. Substantially simultaneous with transmission of the updated center frequency and bandwidth signal from the BSS channel state machine module, the tracking algorithm used a lookup and interpolation routine with a table of fixed coefficients stored in memory to determine the updated filter coefficient values $\alpha$ and $\beta$ by interpolation of the values from the table of fixed coefficients queried with the updated value of the frequency word and/or bandwidth word. Also, substantially simultaneously with the lookup and interpolation routine, a set of values of filter coefficients $\alpha$ and $\beta$ were updated in memory to enable subsequent cycles of lookup, interpolation, and update of filter coefficients $\alpha$ and $\beta$ for subsequent instances of filter input signal. Thus, in two hardware clock cycles, the filter module enabled the signal processing system to quickly and adaptively track quickly changing incoming radar signals (e.g., broad band chirps) without glitches as fast as the updated center frequency and bandwidth signal is transmittable from the BSS channel state machine module, and to switch between radar signals at widely separated frequencies in real time.

The tracking filter disclosed in U.S. Pat. No. 9,954,561 used frequency as its only input parameter for adjusting the coefficients of a second-order IIR filter. In the approach described herein with the SST channel, both frequency and bandwidth need to be used to both track in frequency and bandwidth. For example, with a triple pipelined second-order IIR filter, there would need to be nine 2-D interpolating lookup tables.

Signal Tracking Lookup Table for Threshold

The threshold T controls the starting and stopping of signal tracking in the SST channel 20. Specifically, the SST channel 20 determines whether a signal is present in the tracking filter or not by estimating the SNR and when SNR is above a certain threshold T for reliable tracking, a signal is declared present. If r=S/N (the SNR, where S is the signal energy and N is noise), then $$S/(S+N)=r/(r+1).$$

Assuming a window of time t, take E(y) to be the estimated signal energy S over that time, i.e., signal power. The cueing filters must contain both signal and noise with energy (S+N) over time t. The signal energy S will be overestimated because the only measurements from the filter energies $E(y_{lo})$ and $E(y_{hi})$ contain a certain amount of overlap. Taking the filter responses and overlaps and the frequency and bandwidth (f, w) of the signal into account for a fixed value of r, a single parametric function $T=T_r(f, w)$ can be learned for each filter pair in the cueing system and each frequency and bandwidth value through an offline learning step like the previous one for frequency an d bandwidth. From this, a lookup table can be created so that it is approximately true that $$E(y)/(E(y_{lo})+E(y_{hi})) \approx T_r(f,w)$$

for an SNR value r. Therefore, a value of r can be chosen as the operating SNR level for the SST channel and a single two-input lookup table (with optional interpolation as shown below) can be created to regulate the starting and stopping of tracking in the SST channel at the correct operating SNR level. The implementation of this table on an FPGA or ASIC is described below.

Figure 11:
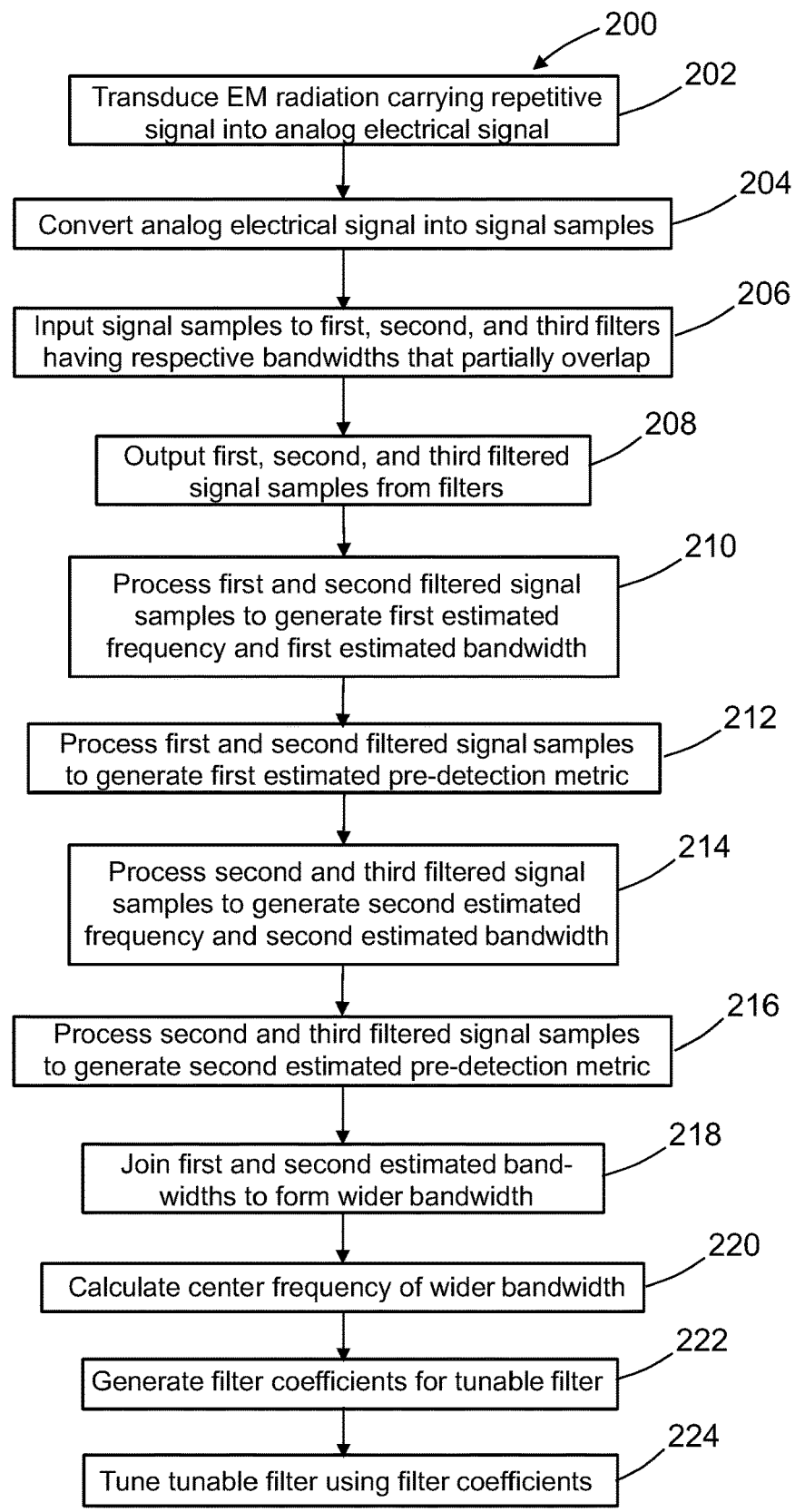
FIG. 11 is a flowchart identifying steps of a signal cueing method in accordance with one embodiment.

In view of the foregoing detailed description, a method for cueing signals in accordance with one embodiment may be characterized as indicated in FIG. 11, which is a flowchart identifying steps of a signal cueing method 200. The signal cueing method 200 starts by transducing electromagnetic radiation that carries a repetitive signal into an analog electrical signal (step 202). Then the analog electrical signal is converted to digital signal samples (step 204). The signal samples are input to first, second, and third filters configured to pass signals having first, second, and third bandwidths respectively (step 206). The first and second bandwidths are partially overlapping; the second and third bandwidths are partially overlapping; and the first and third bandwidths are not partially overlapping. First, second, and third filtered signal samples are output from the first, second, and third filters respectively in response to inputting the digital signal samples (step 208). Then the first and second filtered signal samples are processed to generate digital data representing a first estimated frequency and a first estimated bandwidth (step 210) and generate digital data representing a first estimated pre-detection metric (step 212). Similarly, the second and third filtered signal samples are processed to generate digital data representing a second estimated frequency and a second estimated bandwidth (step 214) and generate digital data representing a second estimated pre-detection metric (step 216). The first and second estimated bandwidths are joined to form a wider bandwidth that is a union of first and second estimated bandwidths (step 218). Also, a center frequency of the wider bandwidth is calculated (step 220). Then filter coefficients which are functions of the calculated center frequency and the wider bandwidth are generated for an available tunable filter if the first and second pre-detection metrics are greater than a specified threshold (step 222). Finally, the available tunable filter is tuned in accordance with the filter coefficients (step 224). The incoming signals samples are then filtered by the tuned filter.

The system described above provides an efficient and low-latency means for cueing the process of signal separation, detection, and tracking in a wideband receiver. The disclosed method uses an array of IIR filters that provide the directions for separating, detecting, and tracking multiple simultaneous signals being received. To summarize, the innovative cueing process disclosed herein has the following advantageous features: (1) low latency cueing pre-detection of signals to reduce SST channel usage; (2) detection performance is dependent directly on the signal bandwidth and SNR rather than on the receiver channel bandwidth; (3) directly commands filter coefficients (or equivalently center frequency and bandwidth) tailored to separate each detected signal; and (4) efficient implementation as an array of IIR filters with a tree of decision nodes that together create the cueing system.

These provide benefits including low latency and efficient signal separation and classification as part of any wideband receiver. Thus, the approach adopted herein replaces a channelized approach that is inefficient in terms of hardware usage and has higher latency and poorer signal classification. Therefore, this solution helps to enable EW or 5G receivers to be made smaller, cost less, and use less power. Correspondingly, this solution can also enable higher performance than is currently possible by enabling more accurate signal extraction and characterization under more difficult signal environments than previous systems.

While systems and methods for cueing unknown signals using an IIR filter array with inverted state tree have been described with reference to various embodiments, it will be understood by those skilled in the art that various changes may be made and equivalents may be substituted for elements thereof without departing from the teachings herein. In addition, many modifications may be made to adapt the concepts and reductions to practice disclosed herein to a particular situation. Accordingly, it is intended that the subject matter covered by the claims not be limited to the disclosed embodiments.

The embodiments disclosed above use one or more processing or computing devices. Such devices typically include a processor, processing device, or controller, such as a general-purpose central processing unit, a microcontroller, a reduced instruction set computer processor, an ASIC, a programmable logic circuit, an FPGA, a digital signal processor, and/or any other circuit or processing device capable of executing the functions described herein. The methods described herein may be encoded as executable instructions embodied in a non-transitory tangible computer-readable storage medium, including, without limitation, a storage device and/or a memory device. Such instructions, when executed by a processing device, cause the processing device to perform at least a portion of the methods described herein.

As used herein, "to estimate a pre-detection metric" means to compute a value using an equation that defines the pre-detection metric.

The invention claimed is:

1. A method for cueing signals comprising:
   transducing electromagnetic radiation carrying a repetitive signal into an analog electrical signal;
   converting the analog electrical signal into digital signal samples;
   inputting the digital signal samples to first and second filters configured to pass first and second bandwidths respectively which are partially overlapping;
   outputting first filtered signal samples from the first filter and second filtered signal samples from the second filter in response to inputting the digital signal samples;
   processing the first and second filtered signal samples to generate digital data representing an estimated frequency and an estimated bandwidth;
   processing the first and second filtered signal samples to generate digital data representing an estimated pre-detection metric;
   determining that the estimated pre-detection metric is greater than a specified threshold;
   generating filter coefficients for an available tunable filter which are functions of the estimated frequency and the estimated bandwidth following a determination that the estimated pre-detection metric is greater than the specified threshold; and
   tuning the available tunable filter in accordance with the filter coefficients.

2. The method as recited in claim 1, wherein processing the first and second filtered signal samples to generate digital data representing an estimated pre-detection metric comprises calculating a normalized signal energy by dividing a sum of energy differences between the outputs of the first and second filters by a sum of the energies of those outputs.

3. The method as recited in claim 1, further comprising:
   inputting digital signal samples to the tunable filter after tuning; and
   outputting filtered signal samples from the tunable filter after tuning and in response to inputting the digital signal samples.

4. The method as recited in claim 3, further comprising: processing the filtered signal samples from the tunable filter to generate pulse descriptor words comprising respective data sets of parameter values of the repetitive signal, wherein each data set of parameter values making up a pulse descriptor word comprises amplitude, time of arrival, and frequency.

5. The method as recited in claim 4, further comprising identifying a source of the repetitive signal based on the data sets of parameter values.

6. The method as recited in claim 4, further comprising directing movement of a vehicle based on the data sets of parameter values.

7. A method for cueing signals comprising:
   transducing electromagnetic radiation carrying a repetitive signal into an analog electrical signal;
   converting the analog electrical signal into digital signal samples;
   inputting the digital signal samples to first, second, and third filters configured to pass first, second, and third bandwidths respectively, wherein the first and second bandwidths are partially overlapping, the second and third bandwidths are partially overlapping, and the first and third bandwidths are not partially overlapping;
   outputting first, second, and third filtered signal samples from the first, second, and third filters respectively in response to inputting the digital signal samples;
   processing the first and second filtered signal samples to generate digital data representing a first estimated frequency and a first estimated bandwidth;
   processing the first and second filtered signal samples to generate digital data representing a first estimated pre-detection metric;
   determining that the first estimated pre-detection metric is greater than a specified threshold;
   processing the second and third filtered signal samples to generate digital data representing a second estimated frequency and a second estimated bandwidth;
   processing the second and third filtered signal samples to generate digital data representing a second estimated pre-detection metric;
   determining that the second estimated pre-detection metric is greater than the specified threshold;
   joining the first and second estimated bandwidths to form a wider bandwidth that is a union of first and second estimated bandwidths;
   calculating a center frequency of the wider bandwidth;
   generating filter coefficients for a tunable filter which are functions of the calculated center frequency and the wider bandwidth following a determination that the first and second estimated pre-detection metrics are greater than the specified threshold; and
   tuning the tunable filter in accordance with the filter coefficients.

8. The method as recited in claim 7, wherein processing the first and second filtered signal samples to generate digital data representing an estimated first pre-detection metric comprises calculating a normalized signal energy by dividing a sum of energy differences between the outputs of the first and second filters by a sum of the energies of those outputs.

9. The method as recited in claim 7, further comprising:
   inputting digital signal samples to the tunable filter after tuning; and
   outputting filtered signal samples from the tunable filter after tuning and in response to inputting the digital signal samples.

10. The method as recited in claim 9, further comprising: processing the filtered signal samples from the tunable filter to generate pulse descriptor words comprising respective data sets of parameter values of the repetitive signal, wherein each data set of parameter values making up a pulse descriptor word comprises amplitude, time of arrival, and frequency.

11. A signal processing system comprising:
- a sensor configured to transduce electromagnetic radiation carrying a repetitive signal into an analog electrical signal;
- an analog-to-digital converter configured to convert the analog electrical signal into signal samples;
- first and second filters connected to receive the signal samples and configured to pass first and second bandwidths respectively which are partially overlapping;
- a first signal frequency/bandwidth estimator connected to receive first and second filtered signal samples from the first and second filters and configured to process filtered signal samples from two filters to generate digital data representing a first estimated frequency and a first estimated bandwidth;
- a first pre-detection estimator connected to receive first and second filtered signal samples from the first and second filters and configured to process filtered signal samples from two filters to generate digital data representing a first estimated pre-detection metric;
- a plurality of signal separation and tracking channels, each signal separation and tracking channel comprising a respective tunable filter;
- a signal separation and tracking controller configured to control tuning of the plurality of signal separation and tracking channels; and
- a first root node connected to receive the first estimated frequency and the first estimated bandwidth from the first signal frequency/bandwidth estimator and receive the first estimated pre-detection metric from the first pre-detection estimator and communicate with the signal separation and tracking controller, wherein the first root node is configured to not send a request for available channel to the signal separation and tracking controller if the first estimated pre-detection metric does not indicate that the signal samples were derived from a repetitive signal.

12. The system as recited in claim 11, wherein the first pre-detection estimator is configured to calculate a normalized signal energy by dividing a sum of energy differences between the outputs of the first and second filters by a sum of the energies of those outputs.

13. The system as recited in claim 11, wherein:
- the signal separation and tracking controller is further configured to send a channel available signal to the first root node in response to receipt of a request for available channel from the first root node if one of the plurality of signal separation and tracking channels is available; and
- the first root node is further configured to output state values representing the first estimated frequency, the first estimated bandwidth, and the first estimated pre-detection metric in response to receipt of the channel available signal from the signal separation and tracking controller.

14. The system as recited in claim 13, further comprising:
- a third filter connected to receive the signal samples and configured to pass a third bandwidth which partially overlaps the second bandwidth;
- a second signal frequency/bandwidth estimator connected to receive second and the filtered signal samples from the second and third filters and configured to process filtered signal samples from two filters to generate digital data representing a second estimated frequency and a second estimated bandwidth;
- a second pre-detection estimator connected to receive second and third filtered signal samples from the second and third filters and configured to process filtered signal samples from two filters to generate digital data representing a second estimated pre-detection metric;
- a second root node connected to receive the second estimated frequency and the second estimated bandwidth from the second signal frequency/bandwidth estimator and receive the second estimated pre-detection metric from the second pre-detection estimator and communicate with the signal separation and tracking controller, wherein the second root node is configured to not send a request for available channel to the signal separation and tracking controller if the second estimated pre-detection metric does not indicate that the signal samples were derived from a repetitive signal.

15. The system as recited in claim 14, wherein:
- the signal separation and tracking controller is further configured to send a channel available signal to the second root node in response to receipt of a request for available channel from the second root node if one of the plurality of signal separation and tracking channels is available; and
- the second root node is further configured to output state values representing the second estimated frequency, the second estimated bandwidth, and the second pre-detection metric in response to receipt of the channel available signal from the signal separation and tracking controller.

16. The system as recited in claim 15, further comprising a non-root node connected to receive the state values representing the first estimated frequency, the first estimated bandwidth, and the first estimated pre-detection metric from the first root node and the second estimated frequency, the second estimated bandwidth, and the second pre-detection metric from the second root node and communicate with the signal separation and tracking controller, wherein the non-root node is configured to calculate and output state values representing a third estimated frequency and a third estimated bandwidth in response to the first and second estimated bandwidths being adjacent or partially overlapping, the third estimated pre-detection metric being a union of the first and second bandwidths and further configured to not send a request for available channel to the signal separation and tracking controller if the third estimated pre-detection metric does not indicate that the signal samples were derived from a repetitive signal.

17. The system as recited in claim 16, wherein:
- the signal separation and tracking controller is further configured to send a channel available signal to the non-root node in response to receipt of a request for available channel from the non-root node if one of the plurality of signal separation and tracking channels is available; and
- the non-root node is further configured to output state values representing the third estimated frequency, the second estimated bandwidth, and the second pre-detection metric in response to receipt of the channel available signal from the signal separation and tracking controller.

18. The system as recited in claim 11, further comprising a pulse descriptor word generator connected to receive filtered signal samples from a tunable filter and configured to process the filtered signal samples from the tunable filter to generate pulse descriptor words comprising respective data sets of parameter values of the repetitive signal, wherein each data set of parameter values making up a pulse descriptor word comprises amplitude, time of arrival, and frequency.

19. A signal cueing system comprising:

first, second, and third filters configured to pass first, second, and third bandwidths, respectively, wherein the first and second bandwidths are partially overlapping, the second and third bandwidths are partially overlapping, and the first and third bandwidths are not partially overlapping;

a first signal frequency/bandwidth estimator connected to receive first and second filtered signal samples from the first and second filters and configured to process filtered signal samples from two filters to generate digital data representing a first estimated frequency and a first estimated bandwidth;

a first pre-detection estimator connected to receive first and second filtered signal samples from the first and second filters and configured to process filtered signal samples from two filters to generate digital data representing a first estimated pre-detection metric;

a first root node connected to receive the first estimated frequency and the first estimated bandwidth from the first signal frequency/bandwidth estimator and receive the first estimated pre-detection metric from the first pre-detection estimator, wherein the first root node is configured to not generate a request for available channel if the first estimated pre-detection metric does not indicate that the signal samples were derived from a repetitive signal;

a second signal frequency/bandwidth estimator connected to receive second and the filtered signal samples from the second and third filters and configured to process filtered signal samples from two filters to generate digital data representing a second estimated frequency and a second estimated bandwidth;

a second pre-detection estimator connected to receive second and third filtered signal samples from the second and third filters and configured to process filtered signal samples from two filters to generate digital data representing a second estimated pre-detection metric;

a second root node connected to receive the second estimated frequency and the second estimated bandwidth from the second signal frequency/bandwidth estimator and receive the second estimated pre-detection metric from the second pre-detection estimator, wherein the second root node is configured to not generate a request for available channel to the signal separation and tracking controller if the second estimated pre-detection metric does not indicate that the signal samples were derived from a repetitive signal; and a non-root node connected to receive the state values representing the first estimated frequency, the first estimated bandwidth, and the first estimated pre-detection metric from the first root node and the second estimated frequency, the second estimated bandwidth, and the second pre-detection metric from the second root node, wherein the non-root node is configured to calculate and output state values representing a third estimated frequency and a third estimated bandwidth in response to the first and second estimated bandwidths being adjacent or partially overlapping, the third estimated pre-detection metric being a union of the first and second bandwidths, and further configured to not generate a request for available channel to the signal separation and tracking controller if the third estimated pre-detection metric does not indicate that the signal samples were derived from a repetitive signal.

20. The system as recited in claim 19, wherein each of the first and second pre-detection estimators is configured to calculate a normalized signal energy by dividing a sum of energy differences between the outputs of two filters by a sum of the energies of those outputs.

* * * * *